United States Patent
Yokoyama

(10) Patent No.: US 10,177,732 B2
(45) Date of Patent: Jan. 8, 2019

(54) PIEZOELECTRIC THIN FILM RESONATOR, FILTER, AND DUPLEXER

(71) Applicant: TAIYO YUDEN CO., LTD., Tokyo (JP)

(72) Inventor: Tsuyoshi Yokoyama, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 172 days.

(21) Appl. No.: 15/214,786

(22) Filed: Jul. 20, 2016

(65) Prior Publication Data

US 2017/0033769 A1    Feb. 2, 2017

(30) Foreign Application Priority Data

Jul. 29, 2015    (JP) .................. 2015-150045

(51) Int. Cl.
| | | |
|---|---|---|
| *H03H 9/02* | (2006.01) | |
| *H03H 9/13* | (2006.01) | |
| *H03H 9/17* | (2006.01) | |

(52) U.S. Cl.
CPC .......... *H03H 9/02015* (2013.01); *H03H 9/13* (2013.01); *H03H 9/173* (2013.01);
(Continued)

(58) Field of Classification Search
CPC ...... H03H 3/02; H03H 9/706; H03H 9/02118; H03H 9/173; H03H 9/175; H03H 2003/021; H03H 9/02015; Y10T 29/42
(Continued)

(56) References Cited

U.S. PATENT DOCUMENTS

| | | |
|---|---|---|
| 6,191,524 B1 | 2/2001 | Sasaki et al. |
| 6,788,170 B1 | 9/2004 | Kaitila et al. |

(Continued)

FOREIGN PATENT DOCUMENTS

| | | |
|---|---|---|
| JP | 2003-505906 A | 2/2003 |
| JP | 2005-159402 A | 6/2005 |

(Continued)

OTHER PUBLICATIONS

"Aluminum Nitride Material Properties", Accuratus Ceramic Corporation, www.accuratus.com, accessed on Mar. 17, 2018.*

(Continued)

*Primary Examiner* — Robert J Pascal
*Assistant Examiner* — Jorge Salazar, Jr.
(74) *Attorney, Agent, or Firm* — Chen Yoshimura LLP

(57) ABSTRACT

A piezoelectric thin film resonator includes: a substrate; a piezoelectric film located on the substrate and having a Poisson's ratio of 0.33 or less; a lower electrode and an upper electrode facing each other across the piezoelectric film; and an insertion film that is located in the piezoelectric film or on a lower surface or an upper surface of the piezoelectric film in an outer peripheral region within a resonance region, in which the lower electrode and the upper electrode face each other across the piezoelectric film, and is not located in a center region of the resonance region, wherein at least one of the lower electrode, the piezoelectric film, and the upper electrode in the outer peripheral region within the resonance region is thinner than the at least one of the lower electrode, the piezoelectric film, and the upper electrode in the center region of the resonance region.

19 Claims, 25 Drawing Sheets

(52) U.S. Cl.
CPC ............ *H03H 9/174* (2013.01); *H03H 9/175* (2013.01); *H03H 9/02118* (2013.01)

(58) Field of Classification Search
USPC ........................................ 333/133, 187, 188
See application file for complete search history.

(56) References Cited

U.S. PATENT DOCUMENTS

| | | | |
|---|---|---|---|
| 6,812,619 | B1 | 11/2004 | Kaitila et al. |
| 9,048,812 | B2 | 6/2015 | Burak et al. |
| 2002/0030424 | A1 | 3/2002 | Iwata |
| 2004/0256961 | A1 | 12/2004 | Mamba et al. |
| 2005/0269904 | A1 | 12/2005 | Oka |
| 2006/0071736 | A1 | 4/2006 | Ruby et al. |
| 2006/0103492 | A1 | 5/2006 | Feng et al. |
| 2006/0226932 | A1 | 10/2006 | Fazzio et al. |
| 2008/0174389 | A1 | 7/2008 | Mori et al. |
| 2008/0179995 | A1 | 7/2008 | Umeda et al. |
| 2008/0258842 | A1 | 10/2008 | Ruby et al. |
| 2010/0033063 | A1* | 2/2010 | Nishihara .......... H03H 9/02118 310/365 |
| 2012/0299664 | A1 | 11/2012 | Hara et al. |
| 2014/0210570 | A1* | 7/2014 | Nishihara ................ H03H 9/70 333/133 |
| 2015/0130559 | A1 | 5/2015 | Yokoyama et al. |
| 2016/0142038 | A1 | 5/2016 | Taniguchi et al. |
| 2017/0033769 | A1 | 2/2017 | Yokoyama |

FOREIGN PATENT DOCUMENTS

| | | |
|---|---|---|
| JP | 2006-020277 A | 1/2006 |
| JP | 2006-109472 A | 4/2006 |
| JP | 2006-295924 A | 10/2006 |
| JP | 2007-6501 A | 1/2007 |
| JP | 2010-045437 A | 2/2010 |
| JP | 2012-244616 A | 12/2012 |
| JP | 2014-161001 A | 9/2014 |
| JP | 2015-095729 A | 5/2015 |
| WO | 02/103900 A1 | 12/2002 |
| WO | 2006/129532 A1 | 12/2006 |
| WO | 2007/052370 A1 | 5/2007 |

OTHER PUBLICATIONS

"AZO Materials", AZO, www.azom.com/properties.aspx?ArticleID=1114, accessed on Mar. 17, 2018.*

Ken L. Telschow et al., "Determination of Lateral Mode Dispersion from Full-field Imaging of Film Bulk Acoustic Resonator Motion", IEEE Ultrasonics Symposium, 2003, p. 280-283 (Mentioned in paragraph No. 4 of the as-filed specification.).

Japanese Office Action dated Jan. 30, 2018, in a counterpart Japanese patent application No. 2015-150045. (A machine translation (not reviewed for accuracy) attached.).

Japanese Office Action dated Jun. 5, 2018, in a counterpart Japanese patent application No. 2015-150045. (A machine translation (not reviewed for accuracy) attached.).

U.S. Appl. No. 15/417,725, filed Jan. 27, 2017.

Japanese Office Action dated Apr. 3, 2018, in a counterpart Japanese patent application No. 2016-020952. A machine translation (not reviewed for accuracy) attached.).

* cited by examiner

PIEZOELECTRIC THIN FILM RESONATOR, FILTER, AND DUPLEXER

CROSS-REFERENCE TO RELATED APPLICATION

This application is based upon and claims the benefit of priority of the prior Japanese Patent Application No. 2015-150045, filed on Jul. 29, 2015, the entire contents of which are incorporated herein by reference.

FIELD

A certain aspect of the present invention relates to a piezoelectric thin film resonator, a filter, and a duplexer.

BACKGROUND

A piezoelectric thin film resonator, which is one of acoustic wave devices, has been used in a filter and a duplexer of wireless devices including mobile phones. The piezoelectric thin film resonator has a structure designed to have a lower electrode and an upper electrode facing each other across a piezoelectric film.

The piezoelectric thin film resonator collaterally generates waves propagating in the planar direction (the lateral direction) called the lateral mode in addition to the thickness extension mode that vibrates in the film thickness direction (the longitudinal direction) of the piezoelectric film. The wave propagating in the lateral direction is reflected by the edge portion of a resonance region. This causes spurious to occur in resonance characteristics. When the piezoelectric thin film resonator in which spurious has occurred is used in a filter, a large loss called a ripple occurs in the passband. Thus, there has been suggested various methods of reducing spurious as disclosed in, for example, Japanese Patent Application Publication Nos. 2003-505906, 2007-6501, and 2005-159402 and International Publication No. WO2006/129532. It has also been known that waves propagating through the piezoelectric film have many modes as disclosed in, for example, Ken L. Telschow, and another, "Determination of Lateral Mode Dispersion from Full-field Imaging of Film Bulk Acoustic Resonator Motion", IEEE ULTRASONICS SYMPOSIUM, 2003, p. 280-283.

However, the conventional methods of reducing spurious deteriorate a Q-value or an electromechanical coupling coefficient.

SUMMARY OF THE INVENTION

According to a first aspect of the present invention, there is provided a piezoelectric thin film resonator including: a substrate; a piezoelectric film that is located on the substrate and has a Poisson's ratio of 0.33 or less; a lower electrode and an upper electrode that face each other across the piezoelectric film; and an insertion film that is located in the piezoelectric film or on a lower surface or an upper surface of the piezoelectric film in an outer peripheral region within a resonance region, in which the lower electrode and the upper electrode face each other across the piezoelectric film, and is not located in a center region of the resonance region, wherein at least one of the lower electrode, the piezoelectric film, and the upper electrode in the outer peripheral region within the resonance region is thinner than the at least one of the lower electrode, the piezoelectric film, and the upper electrode in the center region of the resonance region.

According to a second aspect of the present invention, there is provided a piezoelectric thin film resonator including: a substrate; a piezoelectric film that is located on the substrate and has a Poisson's ratio of 0.33 or less; a lower electrode and an upper electrode that face each other across the piezoelectric film; and an insertion film that is located in the piezoelectric film or on a lower surface or an upper surface of the piezoelectric film in an outer peripheral region within a resonance region, in which the lower electrode and the upper electrode face each other across the piezoelectric film, and is not located in a center region of the resonance region, wherein a cutoff frequency in the outer peripheral region within the resonance region is approximately equal to a cutoff frequency in the center region of the resonance region, and a difference between the cutoff frequency and a minimum frequency of a dispersion curve of a thickness extension mode in the outer peripheral region within the resonance region is less than a difference between the cutoff frequency and a minimum frequency of a dispersion curve of a thickness extension mode in the center region of the resonance region.

According to a third aspect of the present invention, there is provided a filter including any one of the above piezoelectric thin film resonators.

According to a fourth aspect of the present invention, there is provided a duplexer including: a transmit filter; and a receive filter, wherein at least one of the transmit filter and the receive filter is the above filter.

DETAILED DESCRIPTION

Hereinafter, embodiments of the present invention will be described with reference to the accompanying drawings.

First Embodiment

Figure 1:
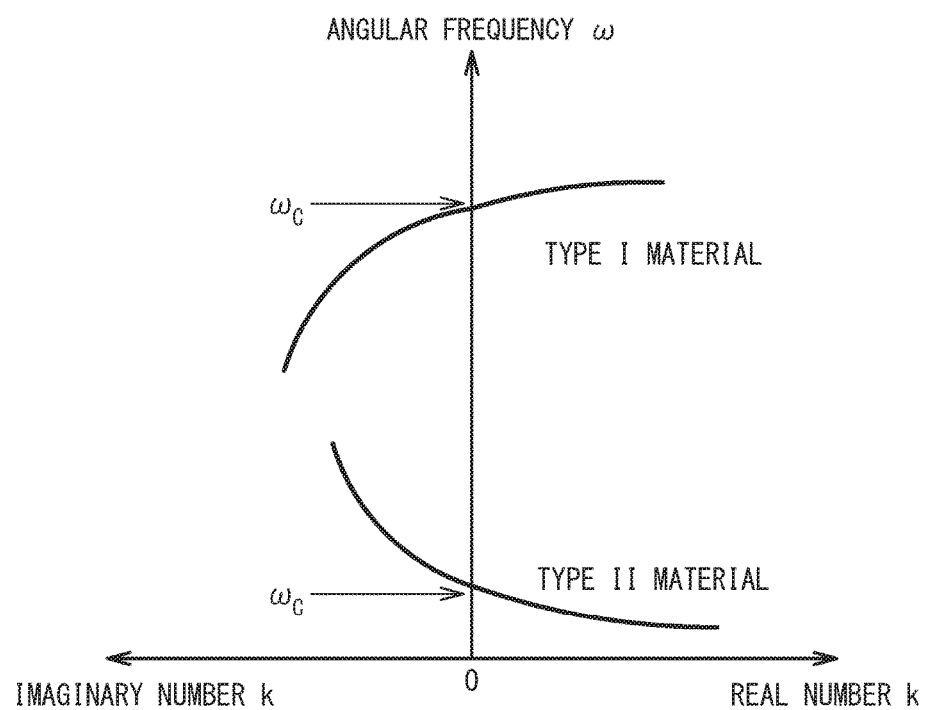
FIG. 1 illustrates a dispersion relation $k(\omega)$ of a piezoelectric film.

With FIG. 1, the dispersion relation k (ω) of a piezoelectric film will be described. The vertical axis in FIG. 1 represents angular frequency ω, the horizontal axis on the right to the vertical axis represents the real number of a wave number k, and the horizontal axis on the left to the vertical axis represents the imaginary number of the wave number k. When the wave number k is an imaginary number, the acoustic wave propagating through the piezoelectric film exponentially decays. The wave number k of 0 (zero) represents a cutoff frequency that is the resonant frequency of the thickness extension mode primarily contributing to the resonance of the piezoelectric thin film resonator. As illustrated in FIG. 1, when the piezoelectric film is made of a Type I material with a Poisson's ratio greater than 0.33, the lateral mode collaterally generated in addition to the thickness extension mode is at a frequency greater than the cutoff frequency. The type I material is, for example, zinc oxide (ZnO). In contrast, when the piezoelectric film is made of a Type II material with a Poisson's ratio of 0.33 or less, the lateral mode is generated at a frequency less than the cutoff frequency. The type II material is, for example, aluminum nitride (AlN).

Figure 2:
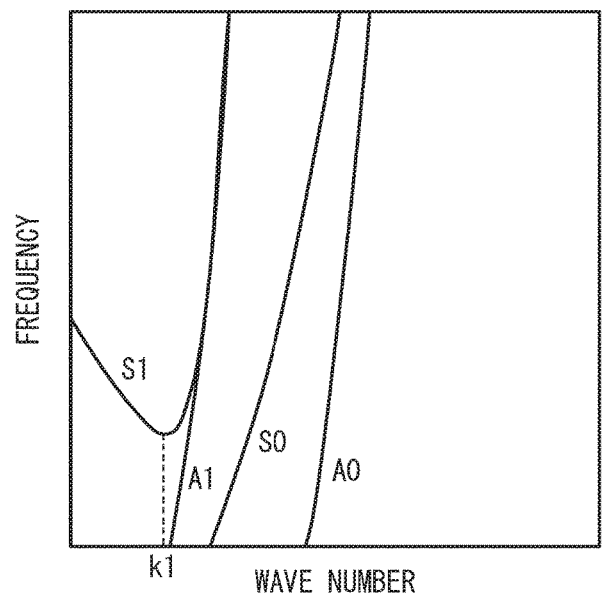
FIG. 2 illustrates dispersion characteristics when the piezoelectric film is made of AlN within the range of a wave number k extended to a larger wave number.

FIG. 1 illustrates only the area where the wave number k of the dispersion curve of the thickness extension mode S1 primarily contributing to the resonance of the piezoelectric thin film resonator is small. FIG. 2 illustrates the dispersion characteristics when the piezoelectric film is made of AlN within the range of the real number of the wave number k extended to a larger real number. As illustrated in FIG. 2, in the dispersion curve of the mode S1, the frequency monotonically decreases till the wave number reaches k1, and the frequency monotonically increases after the wave number exceeds k1. In addition to the mode S1, many modes such as the mode S0, the mode A1, and the mode A0 exist. The mode A0 is the base mode of an asymmetric mode. The mode S0 is the base mode of a symmetric mode. The mode A1 is the first-order mode of the asymmetric mode. The mode S1 is a primary mode that primarily contributes to the resonance of the piezoelectric thin film resonator as described above.

Figure 3A:
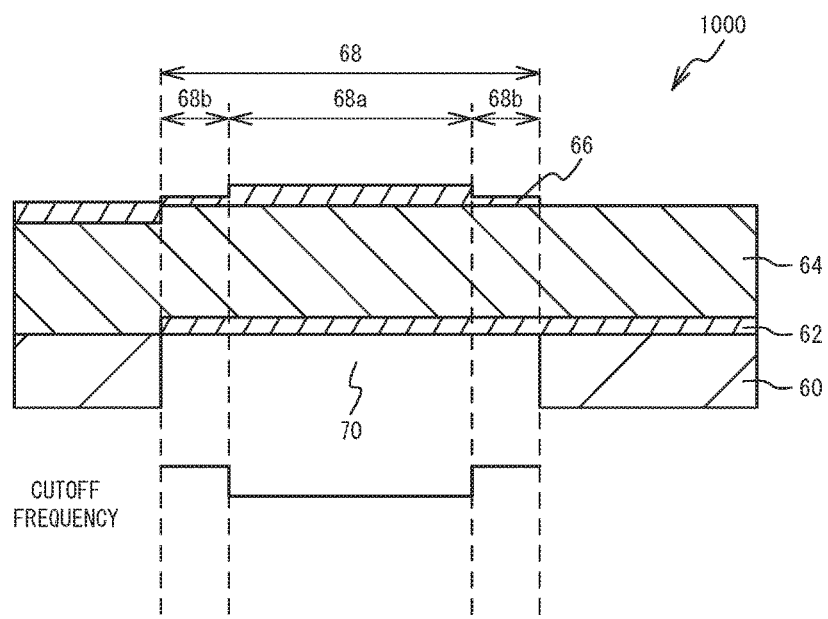
FIG. 3A is a cross-sectional view of a piezoelectric thin film resonator in accordance with a first comparative example.
Figure 3B:
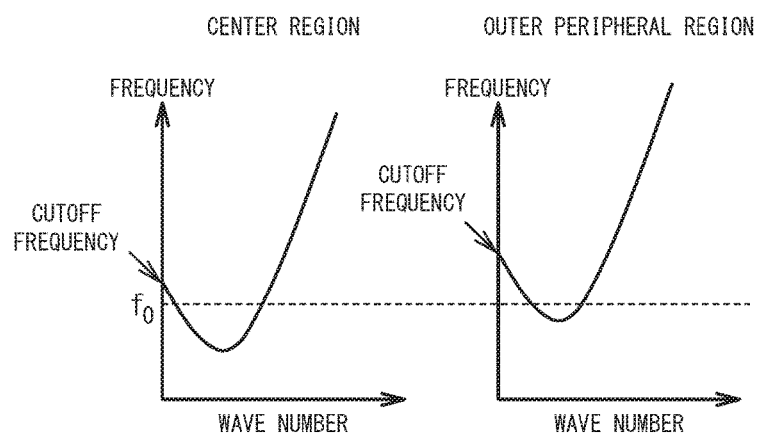
FIG. 3B illustrates dispersion curves of thickness extension modes in the center region and the outer peripheral region of a resonance region.

FIG. 3A is a cross-sectional view of a piezoelectric thin film resonator 1000 in accordance with a first comparative example, and FIG. 3B illustrates the dispersion curves of the thickness extension modes in a center region 68a and an outer peripheral region 68b of a resonance region 68. As illustrated in FIG. 3A, the piezoelectric thin film resonator 1000 of the first comparative example includes a lower electrode 62 formed on a substrate 60. A piezoelectric film 64 made of AlN is formed on the substrate 60 and the lower electrode 62. An upper electrode 66 is formed on the piezoelectric film 64 so as to have a region (the resonance region 68) in which the upper electrode 66 faces the lower electrode 62 across the piezoelectric film 64. The resonance region 68 is a region in which the thickness extension mode resonates. An air gap 70 is formed in a region, including the resonance region 68, of the substrate 60.

The upper electrode 66 in the outer peripheral region 68b within the resonance region 68 is thinner than the upper electrode 66 in the center region 68a of the resonance region 68. Thus, the cutoff frequency in the outer peripheral region 68b is greater than the cutoff frequency in the center region 68a.

As illustrated in FIG. 3B, since the cutoff frequency in the outer peripheral region 68b is greater than the cutoff frequency in the center region 68a, the dispersion curve of the mode S1 in the outer peripheral region 68b shifts to a frequency greater than that of the dispersion curve of the mode S1 in the center region 68a. Thus, the real number of the wave number at a frequency f0, which is less than the resonant frequency in the center region 68a, has a value greater in the outer peripheral region 68b than in the center region 68a. Accordingly, the acoustic wave that has a frequency less than the resonant frequency in the center region 68a and propagates in the lateral direction leaks from the center region 68a to the outside more easily. This reduces the occurrence of spurious due to the lateral mode in the resonance characteristics. However, since the acoustic wave leaks from the center region 68a to the outside, the Q-value decreases across a wide range from the resonant frequency to the antiresonant frequency.

Figure 4A:
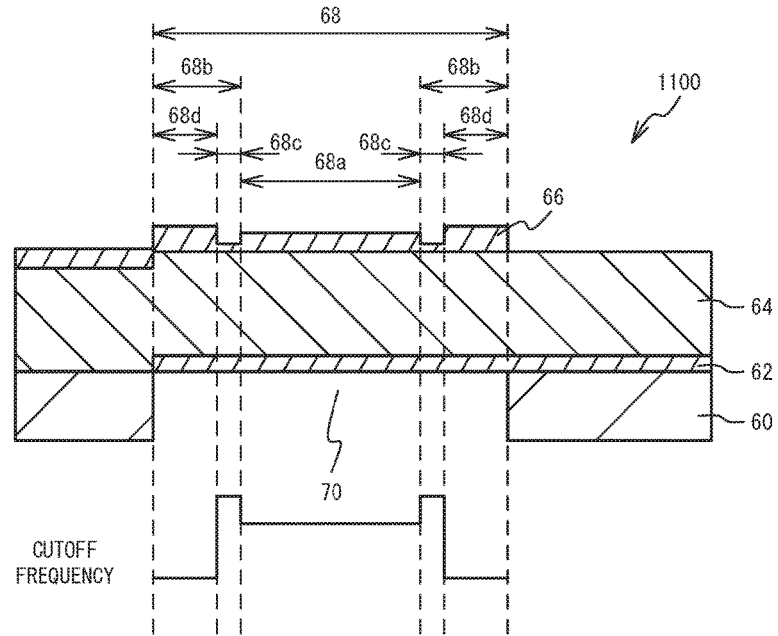
FIG. 4A is a cross-sectional view of a piezoelectric thin film resonator in accordance with a second comparative example.
Figure 4B:
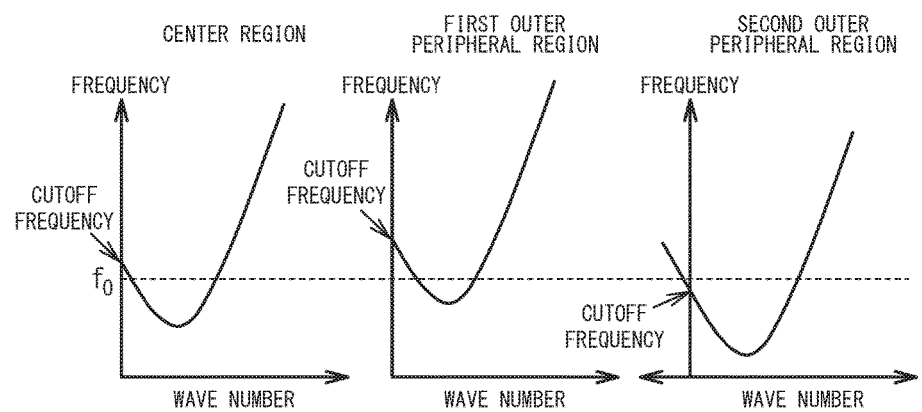
FIG. 4B illustrates the dispersion curves of thickness extension modes in the center region, the first outer peripheral region, and the second outer peripheral region of the resonance region.

FIG. 4A is a cross-sectional view of a piezoelectric thin film resonator 1100 in accordance with a second comparative example, and FIG. 4B illustrates the dispersion curves of the thickness extension modes in the center region 68a, a first outer peripheral region 68c, and a second outer peripheral region 68d of the resonance region 68. As illustrated in FIG. 4A, in the piezoelectric thin film resonator 1100 of the second comparative example, the outer peripheral region 68b within the resonance region 68 includes the first outer peripheral region 68c in which the upper electrode 66 is thinner than in the center region 68a, and the second outer peripheral region 68d in which the upper electrode 66 is thicker than in the center region 68a. Thus, the cutoff frequency in the first outer peripheral region 68c is greater than the cutoff frequency in the center region 68a. The cutoff frequency in the second outer peripheral region 68d is less than the cutoff frequency in the center region 68a.

As illustrated in FIG. 4B, as the cutoff frequency in the first outer peripheral region 68c is greater than the cutoff frequency in the center region 68a, the dispersion curve of the mode S1 in the first outer peripheral region 68c shifts to a frequency greater than that of the dispersion curve of the mode S1 in the center region 68a. As the cutoff frequency in the second outer peripheral region 68d is less than the cutoff frequency in the center region 68a, the dispersion curve of the mode S1 in the second outer peripheral region 68d shifts to a frequency less than that of the dispersion curve of the mode S1 in the center region 68a. Accordingly, the wave number at the frequency f0, which is less than the resonant frequency in the center region 68a, takes a real number of which the value is greater in the first outer peripheral region 68c than in the center region 68a, and takes an imaginary number in the second outer peripheral region 68d. Therefore, the acoustic wave having a frequency less than the resonant frequency in the center region 68a and propagating in the lateral direction leaks from the center region 68a to the first outer peripheral region 68c more easily, and is inhibited from leaking in the second outer peripheral region 68d. As the acoustic wave propagating in the lateral direction leaks to the first outer peripheral region 68c more easily, the occurrence of spurious due to the lateral mode is reduced in the resonance characteristics, and as the acoustic wave propagating in the lateral direction is reflected by the second outer peripheral region 68d, the degradation of the Q-value between the resonant frequency and the antiresonant frequency is inhibited. However, the provision of both the first outer peripheral region 68c with a high cutoff frequency and the second outer peripheral region 68d with a low cutoff frequency decreases the area of the center region 68a, causing an electromechanical coupling coefficient $k^2$ to decrease.

Figure 5A:
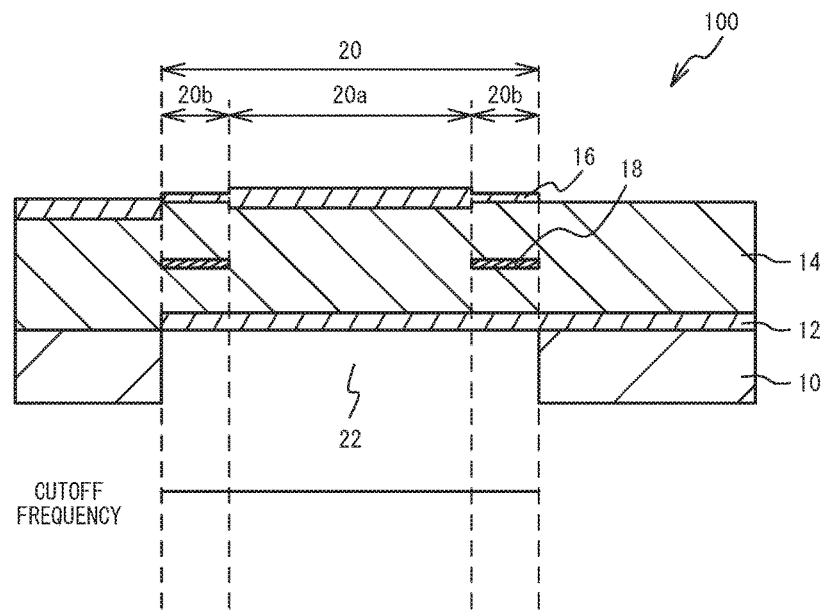
FIG. 5A is a cross-sectional view of a piezoelectric thin film resonator in accordance with a first embodiment.
Figure 5B:
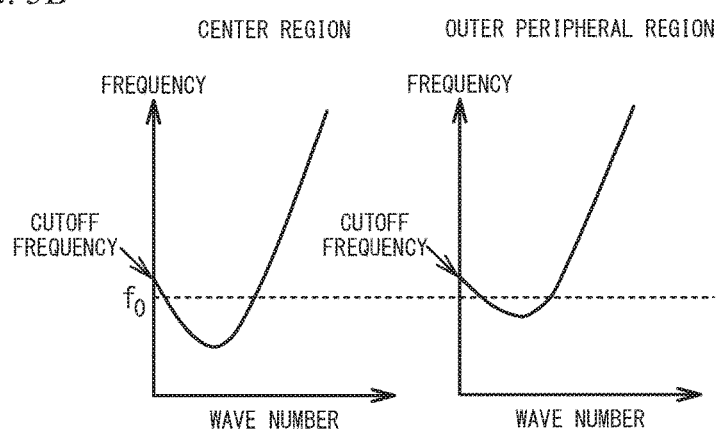
FIG. 5B illustrates the dispersion curves of thickness extension modes in the center region and the outer peripheral region of the resonance region.

FIG. 5A is a cross-sectional view of a piezoelectric thin film resonator 100 in accordance with a first embodiment, and FIG. 5B illustrates the dispersion curves of the thickness extension modes in a center region 20a and an outer peripheral region 20b of a resonance region 20. As illustrated in FIG. 5A, the piezoelectric thin film resonator 100 of the first embodiment includes a lower electrode 12 formed on a substrate 10 made of, for example, a silicon (Si) substrate. The lower electrode 12 is formed of a metal film such as, for example, a chrome (Cr) film or a ruthenium (Ru) film. A piezoelectric film 14 with a Poisson's ratio of 0.33 or less is formed on the substrate 10 and the lower electrode 12. The piezoelectric film 14 is formed of, for example, AlN. An upper electrode 16 is formed on the piezoelectric film 14 so as to have a region (the resonance region 20) in which the upper electrode 16 faces the lower electrode 12 across the piezoelectric film 14. The upper electrode 16 is formed of a metal film such as, for example, a Cr film or a Ru film. The resonance region 20 is a region in which the thickness extension mode resonates. An air gap 22 is formed in a region, including the resonance region 20, of the substrate 10.

In the piezoelectric film 14, an insertion film 18 is formed in the outer peripheral region 20b within the resonance region 20. The insertion film 18 is not formed in the center region 20a of the resonance region 20. The insertion film 18 is made of, for example, a silicon dioxide ($SiO_2$) film. The outer peripheral region 20b within the resonance region 20 is a region that is located within the resonance region 20, includes the outer periphery of the resonance region 20, and is located along the outer periphery. The center region 20a of the resonance region 20 is a region that is located within the resonance region 20, is located further in than the outer peripheral region 20b, and includes the center of the resonance region 20.

The upper electrode 16 in the outer peripheral region 20b is thinner than the upper electrode 16 in the center region 20a. Thus, the thickness of the multilayered film including the lower electrode 12, the piezoelectric film 14, the insertion film 18, and the upper electrode 16 in the resonance region 20 is less in the outer peripheral region 20b than in the center region 20a. Since the insertion film 18 is formed in the outer peripheral region 20b, and the upper electrode 16 in the outer peripheral region 20b is configured to be thinner, the cutoff frequency in the center region 20a is equal to or approximately equal to the cutoff frequency in the outer peripheral region 20b.

As illustrated in FIG. 5B, the dispersion curve of the mode S1 in the center region 20a has a different shape from that in the outer peripheral region 20b. The dispersion curve of the mode S1 in the outer peripheral region 20b has a larger curvature around the minimum frequency than the dispersion curve of the mode S1 in the center region 20a. This is because the insertion film 18 is formed in the piezoelectric film 14 in the outer peripheral region 20b, and thus the material sandwiched between the lower and upper electrodes 12 and 16 has different Poisson's ratios between the center region 20a and the outer peripheral region 20b.

The control of the shapes of the dispersion curves of the mode S1 in the center region 20a and the outer peripheral region 20b allows the value of the real number of the wave number at the frequency f0, which is less than the resonant frequency in the center region 20a, to be greater in the outer peripheral region 20b than in the center region 20a. In other words, the control of the frequency at which the slope of the dispersion curve of the mode S1 is zero allows the value of the real number of the wave number at the frequency f0, which is less than the resonant frequency in the center region 20a, to be greater in the outer peripheral region 20b than in the center region 20a. Accordingly, the acoustic wave having a frequency less than the resonant frequency in the center region 20a and propagating in the lateral direction leaks from the center region 20a to the outside more easily, and the occurrence of spurious due to the lateral mode is inhibited in the resonance characteristics. In addition, the provision of the insertion film 18 reduces the generation of the acoustic wave in the mode S0 between the resonant frequency and the antiresonant frequency. As the generation of the acoustic wave in the mode S0 itself is reduced, the leakage of the acoustic wave is also reduced. As a result, the degradation of the Q-value between the resonant frequency and the antiresonant frequency is inhibited. Additionally, as the cutoff frequency in the center region 20a can be made equal to or approximately equal to the cutoff frequency in the outer peripheral region 20b, the degradation of the electromechanical coupling coefficient k2 is inhibited.

As described above, in the first embodiment, as illustrated in FIG. 5A, the insertion film 18 is located in the outer peripheral region 20b within the resonance region 20, and the thickness of the upper electrode 16 is less in the outer peripheral region 20b than in the center region 20a. This configuration makes the cutoff frequency in the outer peripheral region 20b approximately equal to the cutoff frequency in the center region 20a, and makes the difference between the cutoff frequency and the minimum frequency of the dispersion curve of the thickness extension mode in the outer peripheral region 20b less than the difference between the cutoff frequency and the minimum frequency of the dispersion curve of the thickness extension mode in the center region 20a as illustrated in FIG. 5A and FIG. 5B. Thus, as described above, the degradation of the Q-value and the electromechanical coupling coefficient k2 is inhibited, and spurious is reduced. A case where the cutoff frequencies are approximately equal to each other includes not only a case where the cutoff frequencies are completely identical but also a case where the cutoff frequencies are identical to the extent that the degradation of the electromechanical coupling coefficient k2 is inhibited.

Second Embodiment

Figure 6A:
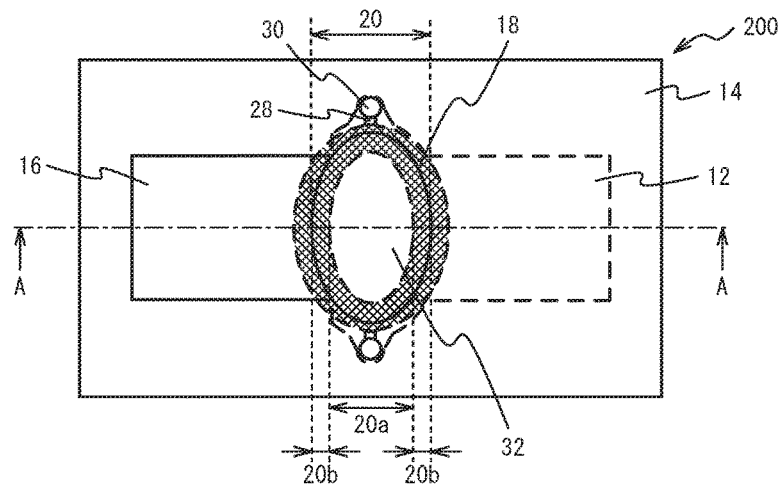
FIG. 6A is a top view of a piezoelectric thin film resonator in accordance with a second embodiment.
Figure 6B:
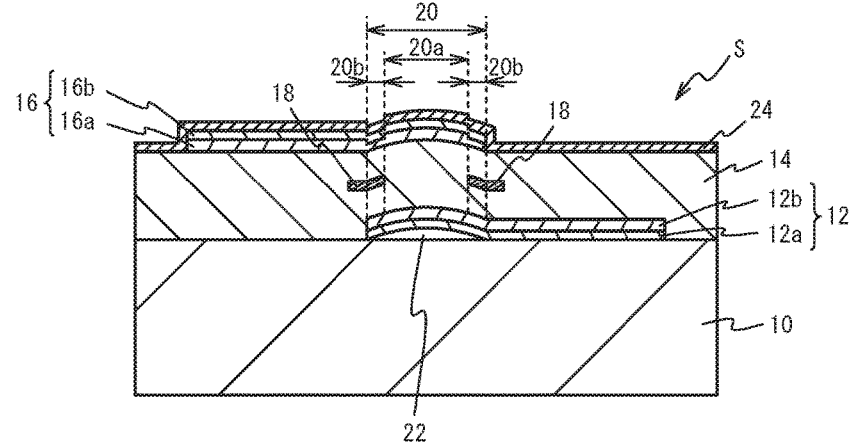
FIG. 6B and FIG. 6C are cross-sectional views taken along line A-A in FIG. 6A.
Figure 6C:
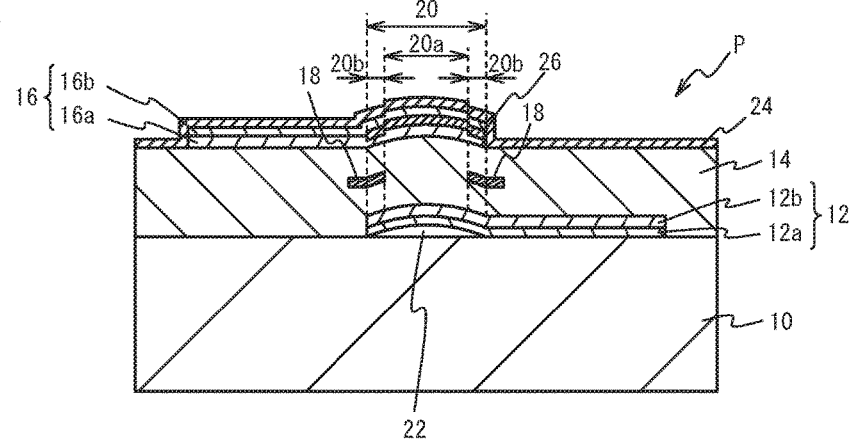

FIG. 6A is a top view of a piezoelectric thin film resonator 200 in accordance with a second embodiment, and FIG. 6B and FIG. 6C are cross-sectional views taken along line A-A of FIG. 6A. FIG. 6B is a cross-sectional view of a series resonator S of a ladder-type filter, and FIG. 6C is a cross-sectional view of a parallel resonator P of the ladder-type filter.

As illustrated in FIG. 6A and FIG. 6B, the series resonator S includes the lower electrode 12 formed on the substrate 10. The air gap 22 having a dome-shaped bulge toward the lower electrode 12 is formed between the flat principal surface of the substrate 10 and the lower electrode 12. The dome-shaped bulge is a bulge having a shape with which the height of the air gap 22 is low near the periphery of the air gap 22 and the height of the air gap 22 increases at closer distances to the center of the air gap 22, for example. The lower electrode 12 includes a lower layer 12a and an upper layer 12b. The lower layer 12a is made of, for example, a Cr film, and the upper layer 12b is made of, for example, a Ru film.

Formed on the substrate 10 and the lower electrode 12 is the piezoelectric film 14 mainly composed of AlN having the (002) direction as a main axis. The upper electrode 16 is formed on the piezoelectric film 14 so as to have a region (the resonance region 20) in which the upper electrode 16 faces the lower electrode 12 across the piezoelectric film 14. The upper electrode 16 includes a lower layer 16a and an upper layer 16b. The lower layer 16a is made of, for example, a Ru film, and the upper layer 16b is made of, for example, a Cr film. The resonance region 20 is a region having, for example, an elliptical shape, and in which the thickness extension mode resonates.

In the piezoelectric film 14, the insertion film 18 is formed in the outer peripheral region 20b within the resonance region 20. The insertion film 18 is not formed in the center region 20a of the resonance region 20. The insertion film 18 is made of, for example, a $SiO_2$ film. The insertion film 18 is formed in the entire periphery of the outer peripheral region 20b within the resonance region 20, and is formed to extend from the outer peripheral region 20b to the outside of the resonance region 20. The insertion film 18 may be formed in the middle part in the film thickness direction of the piezoelectric film 14, or may be formed in other than the middle part. As described in the first embodiment, the outer peripheral region 20b is a region that is located within the resonance region 20, includes the outer periphery of the resonance region 20, and is located along the outer periphery. The outer peripheral region 20b has, for example, a ring shape. The center region 20a of the resonance region 20 is a region that is located within the resonance region 20, located further in than the outer peripheral region 20b, and includes the center of the resonance region 20.

The upper electrode 16 in the outer peripheral region 20b is thinner than the upper electrode 16 in the center region 20a across the entire periphery of the outer peripheral region 20b. For example, the thickness of the lower layer 16a of the upper electrode 16 is less in the outer peripheral region 20b than in the center region 20a, and the thickness of the upper layer 16b of the upper electrode 16 is the same between the center region 20a and the outer peripheral region 20b. A silicon oxide film as a frequency adjusting film 24 is formed on the upper electrode 16. The frequency adjusting film 24 may act as a passivation film. As the upper electrode 16 is thinner in the outer peripheral region 20b than in the center region 20a, the thickness of the multilayered film including the lower electrode 12, the piezoelectric film 14, the insertion film 18, the upper electrode 16, and the frequency adjusting film 24 in the resonance region 20 is less in the outer peripheral region 20b than in the center region 20a.

An introduction path 28 used to etch a sacrifice layer is formed in the lower electrode 12 and the piezoelectric film 14. The sacrifice layer is used to form the air gap 22. The vicinity of the tip of the introduction path 28 is not covered with the lower electrode 12 or the piezoelectric film 14, and includes a hole portion 30 formed therein.

As illustrated in FIG. 6A and FIG. 6C, compared to the series resonator S, the parallel resonator P includes a mass load film 26 formed between the lower and upper layers 16a and 16b of the upper electrode 16 in the resonance region 20. The mass load film 26 is made of, for example, a titanium (Ti) film. Other configurations are the same as those of the series resonator S, and thus the description is omitted.

The difference in the resonant frequency between the series and parallel resonators S and P is adjusted with the film thickness of the mass load film 26. The resonant frequency of each of the series and parallel resonators S and P is adjusted with the film thickness of the corresponding frequency adjusting film 24.

For example, when the piezoelectric thin film resonator has a resonant frequency of 2 GHz, the lower layer 12a made of a Cr film in the lower electrode 12 has a thickness of 100 nm, and the upper layer 12b made of a Ru film has a thickness of 250 nm. The piezoelectric film 14 made of an AlN film has a thickness of 1100 nm, and the insertion film 18 in the piezoelectric film 14 has a thickness of 150 nm.

The lower layer 16a made of a Ru film in the upper electrode 16 has a thickness of 230 nm in the center region 20a of the resonance region 20 and 50 nm in the outer peripheral region 20b. The upper layer 16b made of a Cr film in the upper electrode 16 has a thickness of 50 nm. The frequency adjusting film 24 made of a silicon oxide film has a thickness of 50 nm. The mass load film 26 made of a Ti film has a thickness of 120 nm. The thickness of each layer is appropriately designed to obtain desired resonance characteristics.

The substrate 10 may be, for example, a quartz substrate, a glass substrate, a ceramic substrate, or a gallium arsenide (GaAs) substrate instead of a Si substrate. The lower electrode 12 and the upper electrode 16 may be made of a single layer film of, for example, aluminum (Al), titanium (Ti), copper (Cu), molybdenum (Mo), tungsten (W), tantalum (Ta), platinum (Pt), rhodium (Rh), or iridium (Ir), or a multilayered film of at least two of them instead of Cr and Ru. The piezoelectric film 14 may be made of a material other than AlN as long as the material has a Poisson's ratio of 0.33 or less. The piezoelectric film 14 may be mainly composed of AlN and include other elements to improve the resonance characteristics or the piezoelectricity. For example, the use of scandium (Sc) as an additive element improves the piezoelectricity of the piezoelectric film 14.

The frequency adjusting film 24 may be made of a silicon nitride film or an aluminum nitride film instead of a silicon oxide film. The mass load film 26 may be made of a single layer metal film of Ru, Cr, Al, Cu, Mo, W, Ta, Pt, Rh, or Ir, or a multilayered film of at least two of them instead of Ti. Alternatively, metal nitride such as, for example, silicon nitride or silicon oxide or an insulating film made of metal oxide may be used. The mass load film 26 may be formed, for example, below the lower electrode 12, between the layers of the lower electrode 12, on the upper electrode 16, between the lower electrode 12 and the piezoelectric film 14, or between the piezoelectric film 14 and the upper electrode 16 instead of between the layers of the upper electrode 16. The mass load film 26 may be larger than the resonance region 20 as long as the mass load film 26 includes the resonance region 20.

Figure 7A:
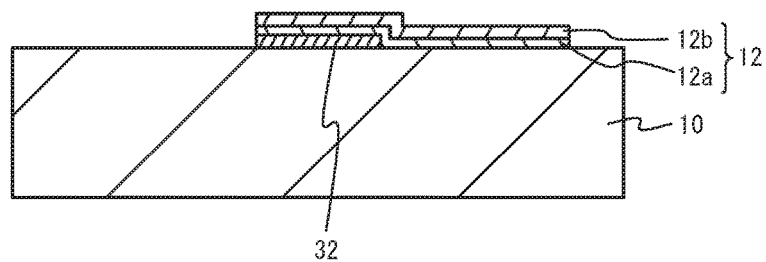
FIG. 7A through FIG. 7C are cross-sectional views illustrating a method of fabricating the piezoelectric thin film resonator of the second embodiment.
Figure 7B:
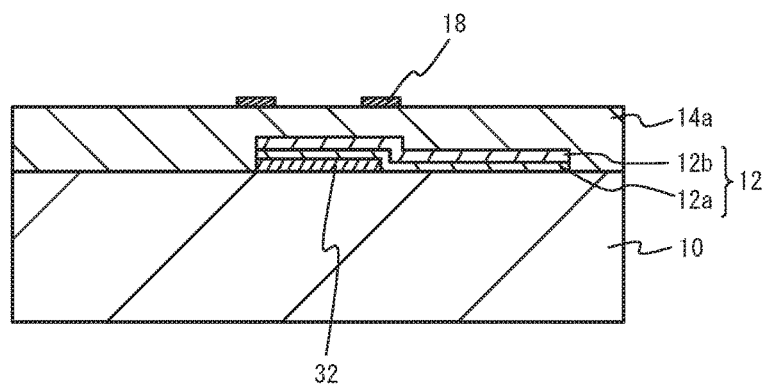
Figure 7C:
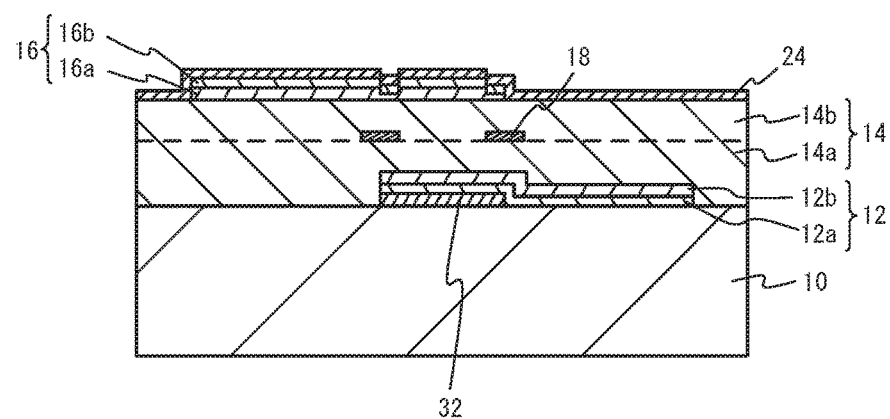

A method of fabricating the piezoelectric thin film resonator 200 of the second embodiment will be described by using the series resonator S as an example. FIG. 7A through FIG. 7C are cross-sectional views illustrating the method of fabricating the piezoelectric thin film resonator 200 of the second embodiment. As illustrated in FIG. 7A, a sacrifice layer 32 used to form the air gap 22 is formed on the flat principal surface of the substrate 10. The sacrifice layer 32 is formed by, for example, sputtering, vacuum evaporation, or Chemical Vapor Deposition (CVD). The sacrifice layer 32 may be made of a material such as, for example, magnesium oxide (MgO), zinc oxide (ZnO), germanium (Ge), or silicon dioxide ($SiO_2$) that easily dissolves in an etching liquid or an etching gas. The sacrifice layer 32 has a thickness of, for example, approximately 10 to 100 nm. Then, the sacrifice layer 32 is patterned into a desired shape by photolithography and etching. The shape of the sacrifice layer 32 corresponds to the planar shape of the air gap 22, and includes, for example, a region to be the resonance region 20.

Then, the lower and upper layers 12a and 12b are formed, as the lower electrode 12, on the sacrifice layer 32 and the substrate 10. The lower electrode 12 is formed by, for example, sputtering, vacuum evaporation, or CVD. Then, the lower electrode 12 is patterned into a desired shape by photolithography and etching. The lower electrode 12 may be formed by liftoff.

As illustrated in FIG. 7B, a first piezoelectric film 14a and the insertion film 18 are formed on the lower electrode 12 and the substrate 10. The first piezoelectric film 14a and the insertion film 18 are formed by, for example, sputtering, vacuum evaporation, or CVD. Then, the insertion film 18 is patterned into a desired shape by photolithography and etching. The insertion film 18 may be formed by liftoff.

As illustrated in FIG. 7C, a second piezoelectric film 14b is formed on the first piezoelectric film 14a and the insertion film 18. The second piezoelectric film 14b is formed by, for example, sputtering, vacuum evaporation, or CVD. The first and second piezoelectric films 14a and 14b form the piezoelectric film 14. The lower and upper layers 16a and 16b are formed, as the upper electrode 16, on the piezoelectric film 14. The upper electrode 16 is formed by, for example, sputtering, vacuum evaporation, or CVD. Here, the lower layer 16a of the upper electrode 16 is formed so that the film thickness differs between the center region 20a and the outer peripheral region 20b of the resonance region 20. The lower layer 16a may be formed as follows. The lower layer 16a with a film thickness equal to the film thickness in the outer peripheral region 20b in which the film thickness is relatively thin is formed across the entire surface, and then the lower layer 16a is additionally formed in the center region 20a. Alternatively, the lower layer 16a with a film thickness equal to the film thickness in the center region 20a in which the film thickness is relatively thick is formed across the entire surface, and then the lower layer 16a formed in the outer peripheral region 20b is etched. Then, the upper electrode 16 is patterned into a desired shape by photolithography and etching. The frequency adjusting film 24 is formed on the upper electrode 16 by, for example, sputtering or CVD.

In the parallel resonator P of FIG. 6C, the lower layer 16a of the upper electrode 16 is formed, and the mass load film 26 is then formed by, for example, sputtering, vacuum evaporation method, or CVD. The mass load film 26 is patterned into a desired shape by photolithography and etching. The upper layer 16b of the upper electrode 16 is then formed.

After the formation of the frequency adjusting film 24, an etching liquid to etch the sacrifice layer 32 is introduced into the sacrifice layer 32 below the lower electrode 12 through the hole portion 30 and the introduction path 28 (see FIG. 6A). This process removes the sacrifice layer 32. The substance used to etch the sacrifice layer 32 is preferably a substance that does not etch materials included in the resonator except the sacrifice layer 32. For example, the etching substance is preferably a substance that does not etch the lower electrode 12 or the piezoelectric film 14 with which the etching substance contacts. The stress on the multilayered film including the lower electrode 12, the piezoelectric film 14, and the upper electrode 16 is configured to be a compression stress. This configuration allows the multilayered film to bulge out to the opposite side of the substrate 10 so as to separate from the substrate 10 when the sacrifice layer 32 is removed. Thus, the air gap 22 having a dome-shaped bulge is formed between the substrate 10 and the lower electrode 12. The process including the above steps forms the piezoelectric thin film resonator 200 of the second embodiment.

A description will next be given of a simulation conducted on the piezoelectric thin film resonator 200 of the second embodiment by the inventors. The inventors investigated how the film thickness of the upper electrode 16 in the outer peripheral region 20b affects spurious occurring at frequencies less than the resonant frequency with respect to the piezoelectric thin film resonator 200 of the second embodiment illustrated in FIG. 6A and FIG. 6B by using a finite element method. The simulation was conducted on first and second specimens (the second embodiment), and a third specimen (a third comparative example).

The first specimen was configured so that the lower layer 12a of the lower electrode 12 was made of a Cr film with a thickness of 100 nm, the upper layer 12b was made of a Ru film with a thickness of 200 nm, and the piezoelectric film 14 was made of an AlN film with a thickness of 1260 nm. The upper electrode 16 was configured to include only the lower layer 16a made of a Ru film, and to have a thickness of 230 nm in the center region 20a and 50 nm in the outer peripheral region 20b. The insertion film 18 was configured to be made of a $SiO_2$ film with a thickness of 125 nm, and the length of the insertion film 18 inserted into the resonance region 20 (i.e., the width of the outer peripheral region 20b) was configured to be 2.5 μm.

The second specimen was configured to be the same as the first specimen except that the upper electrode 16 had a thickness of 60 nm in the outer peripheral region 20b. The third specimen was configured to be the same as the first specimen except that the upper electrode 16 had a thickness of 230 nm, which is equal to the thickness in the center region 20a, in the outer peripheral region 20b.

Table 1 presents the simulation results of the cutoff frequencies of the center regions 20a and the outer peripheral regions 20b of the resonance regions 20 of the first through third specimens. As presented in table 1, in the first specimen, the cutoff frequency in the center region 20a is equal to the cutoff frequency in the outer peripheral region 20b, while in the second specimen, the cutoff frequency in the center region 20a is close to the cutoff frequency in the outer peripheral region 20b. In the third specimen, the cutoff frequency in the center region 20a is away from the cutoff frequency in the outer peripheral region 20b.

TABLE 1

|  | Cutoff frequency in the center region [MHz] | Cutoff frequency in the outer peripheral region [MHz] |
| --- | --- | --- |
| First specimen (second embodiment) | 2010 | 2010 |
| Second specimen (second embodiment) | 2010 | 1978 |
| Third specimen (third comparative example) | 2010 | 1616 |

Figure 8A:
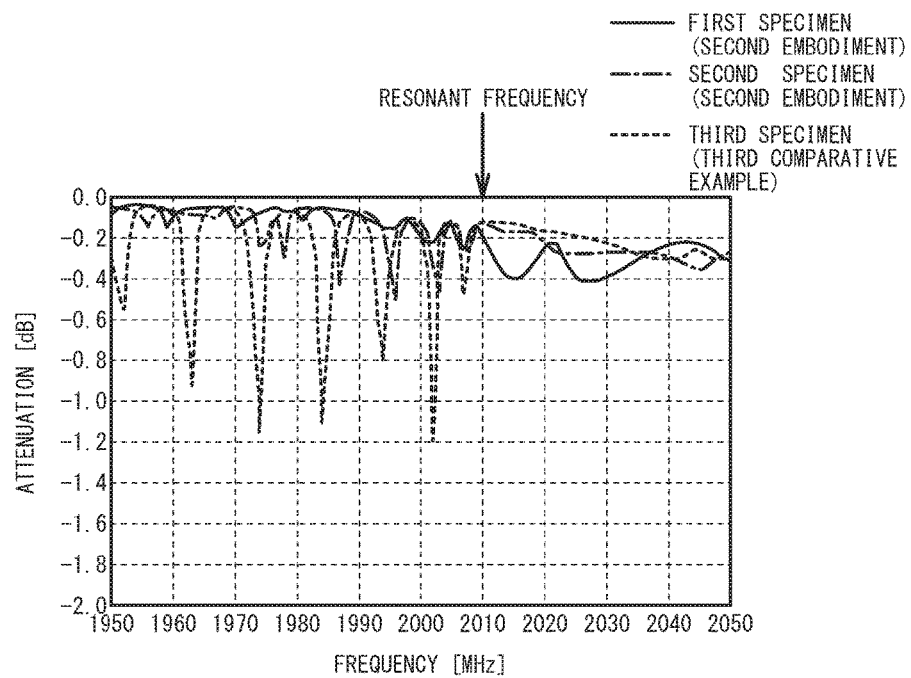
FIG. 8A and FIG. 8B illustrate the results of a simulation investigating spurious.
Figure 8B:
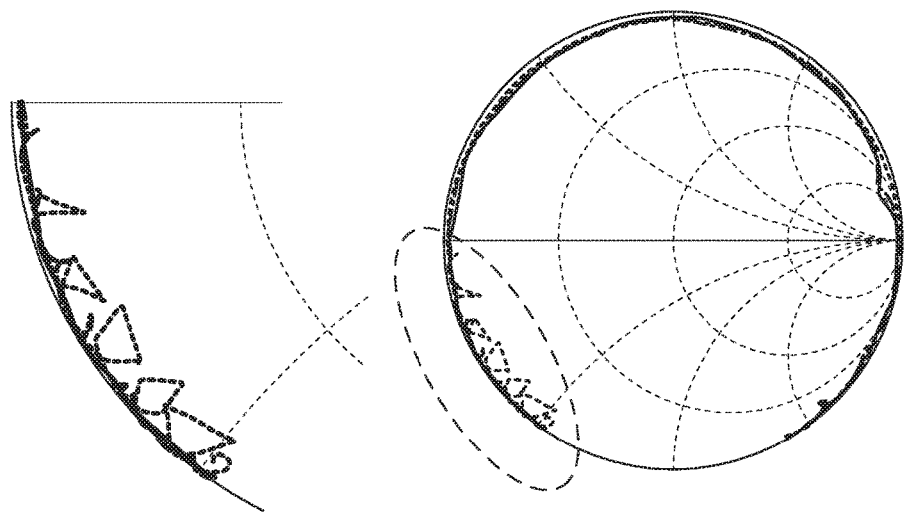

FIG. 8A and FIG. 8B illustrate the results of a simulation investigating spurious. FIG. 8A illustrates a reflection characteristic (S11) near the resonant frequency, and FIG. 8B is a Smith chart. The solid lines indicate the simulation result of the first specimen, the chain lines indicate the simulation result of the second specimen, and the dotted lines indicate the simulation result of the third specimen. As presented in table 1, FIG. 8A, and FIG. 8B, it is confirmed that the spurious occurring at frequencies less than the resonant frequency is reduced when the thickness of the upper electrode 16 is made thinner in the outer peripheral region 20b than in the center region 20a to make the cutoff frequencies in the center region 20a and the outer peripheral region 20b close to each other.

Figure 9A:
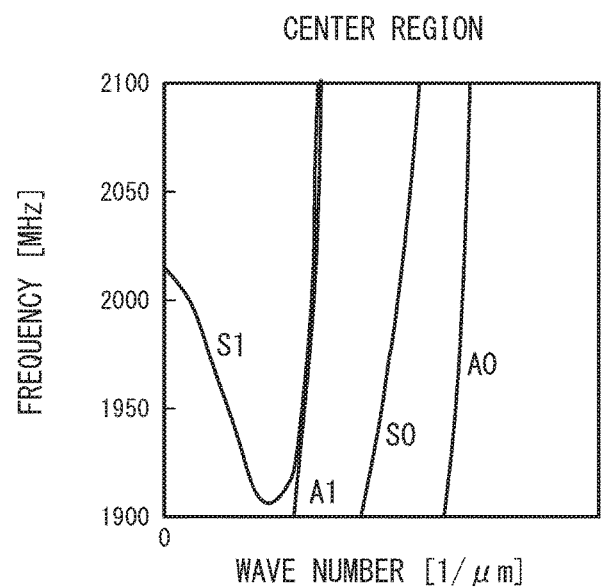
FIG. 9A and FIG. 9B illustrate the results of a simulation investigating a dispersion curve.
Figure 9B:
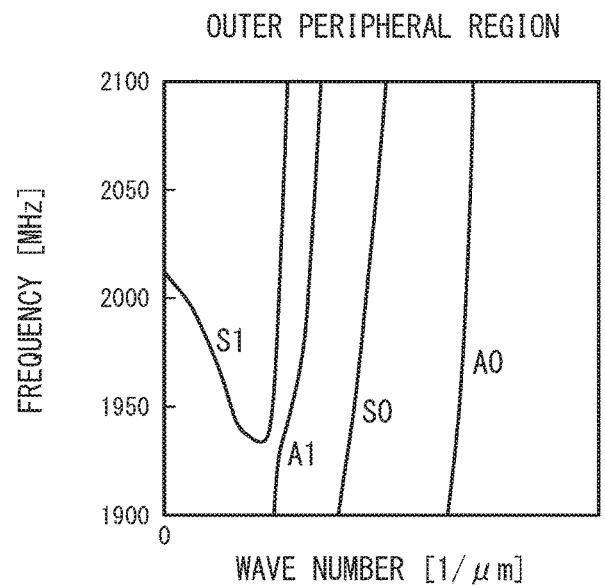

The inventors next investigated the dispersion curves of the thickness extension modes in the center region 20a and the outer peripheral region 20b with respect to the first specimen by using the finite element method. FIG. 9A and FIG. 9B illustrate the results of a simulation investigating the dispersion curves. FIG. 9A illustrates the dispersion curve of the thickness extension mode in the center region 20a, and FIG. 9B illustrates the dispersion curve of the thickness extension mode in the outer peripheral region 20b. As illustrated in FIG. 9A and FIG. 9B, the cutoff frequency at which the wave number is 0 (zero) is 2010 MHz in both cases, and the minimum frequency (the frequency at which the slope is zero) of the dispersion curve of the mode S1 is approximately 1905 MHz in FIG. 9A, and approximately 1935 MHz in FIG. 9B. This result allows to confirm that spurious occurring at frequencies less than the resonant frequency is reduced when the difference between the cutoff frequency and the minimum frequency of the dispersion curve of the thickness extension mode in the outer peripheral region 20b is made less than the difference between the cutoff frequency and the minimum frequency of the dispersion curve of the thickness extension mode in the center region 20a.

Therefore, the insertion film 18 is formed in the outer peripheral region 20b, and the film thickness of the upper electrode 16 is made less in the outer peripheral region 20b than in the center region 20a to make the cutoff frequency in the outer peripheral region 20b approximately equal to the cutoff frequency in the center region 20a to make the difference between the cutoff frequency and the minimum frequency of the dispersion curve of the thickness extension mode in the outer peripheral region 20b less than the difference between the cutoff frequency and the minimum frequency of the dispersion curve of the thickness extension mode in the center region 20a. The simulation assures that the above configuration reduces spurious.

The inventors next investigated the Q-value and the electromechanical coupling coefficient k2 at the antiresonant frequency with respect to the first specimen by using the finite element method. For comparison, the simulation was also conducted on a fourth specimen that was the piezoelectric thin film resonator 1100 of the second comparative example illustrated in FIG. 4A. The fourth specimen was configured so that the upper electrode 66 had a thickness of 230 nm in the center region 68a, 220 nm in the first outer peripheral region 68c, and 330 nm in the second outer peripheral region 68d. Additionally, the first outer peripheral region 68c was configured to have a length of 4.0 μm, and the second outer peripheral region 68d was configured to have a length of 2.5 μm. Other configurations were the same as those of the first specimen. Table 2 presents the simulation results of the Q-value and the electromechanical coupling coefficient k2 at the antiresonant frequency. As presented in table 2, in the first specimen, the Q-value and the electromechanical coupling coefficient k2 at the antiresonant frequency are improved compared with those in the fourth specimen.

TABLE 2

|  | Q-value at the antiresonant frequency | Electromechanical coupling coefficient k2 [%] |
| --- | --- | --- |
| First specimen (second embodiment) | 1467 | 7.18 |
| Fourth specimen (second comparative example) | 1354 | 7.08 |

Accordingly, the insertion film 18 is formed in the outer peripheral region 20b, and the film thickness of the upper electrode 16 is made less in the outer peripheral region 20b than in the center region 20a to make the cutoff frequency in the outer peripheral region 20b approximately equal to the cutoff frequency in the center region 20a to make the difference between the cutoff frequency and the minimum frequency of the dispersion curve of the thickness extension mode in the outer peripheral region 20b less than the difference between the cutoff frequency and the minimum frequency of the dispersion curve of the thickness extension mode in the center region 20a. The simulation assures that the above configuration improves the Q-value and the electromechanical coupling coefficient k2 at the antiresonant frequency.

The inventors next investigated the dispersion curves of the thickness extension modes in the outer peripheral regions 20b of piezoelectric thin film resonators using different materials for the insertion film 18 by using the finite element method. The piezoelectric thin film resonators used for the simulation were configured to be the same as the first specimen except the insertion film 18. The insertion film 18 was configured to have a thickness of 125 nm and a length of 1.9 µm. Table 3 lists the materials of the insertion film 18 used for the simulation and the material constant of each material. In table 3, the acoustic impedance is represented by a value obtained by normalizing the product of the density and the Young's modulus by the acoustic impedance of AlN. As listed in table 3, the simulation was conducted by using $SiO_2$, Ru, Cr, Ti, Al, Ta, W, or Mo for the insertion film 18.

TABLE 3

| Insertion film | Density [g/cm$^3$] | Poisson's ratio | Young's modulus [GPa] | Acoustic impedance |
|---|---|---|---|---|
| $SiO_2$ | 2.2 | 0.175 | 79 | 0.17 |
| Ru | 12.37 | 0.3 | 447 | 5.47 |
| Cr | 7.14 | 0.21 | 279 | 1.97 |
| Ti | 4.507 | 0.32 | 116 | 0.52 |
| Al | 2.7 | 0.35 | 70 | 0.19 |
| Ta | 16.65 | 0.34 | 186 | 3.06 |
| W | 19.25 | 0.28 | 411 | 7.83 |
| Mo | 10.28 | 0.28 | 329 | 3.35 |
| AlN | 3.26 | 0.25 | 310 | 1 |

Figure 10:
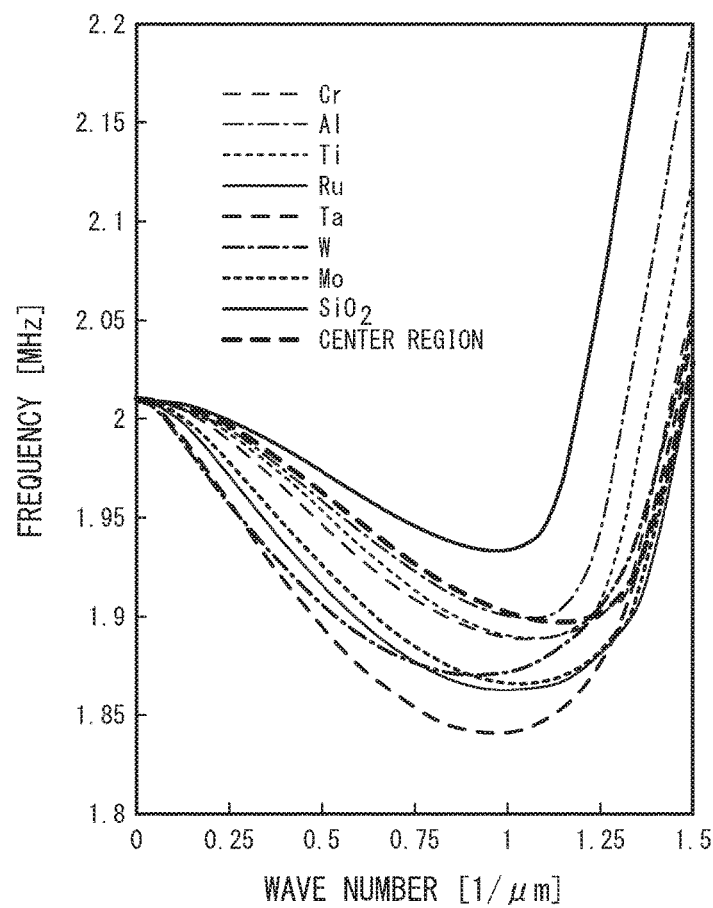
FIG. 10 illustrates the results of a simulation investigating the dispersion curves of thickness extension modes in the outer peripheral regions within the resonance regions of piezoelectric thin film resonators using different materials for an insertion film.

FIG. 10 illustrates the results of a simulation investigating the dispersion curves of the thickness extension modes in the outer peripheral regions 20b within the resonance regions 20 of the piezoelectric thin film resonators using different materials for the insertion film 18. The bold dashed line indicates the dispersion curve of the thickness extension mode in the center region 20a of the resonance region 20. As illustrated in FIG. 10, when the insertion film 18 is made of $SiO_2$ or Al, the minimum frequency of the dispersion curve of the thickness extension mode in the outer peripheral region 20b shifts to a frequency greater than the minimum frequency of the dispersion curve of the thickness extension mode in the center region 20a.

Figure 11A:
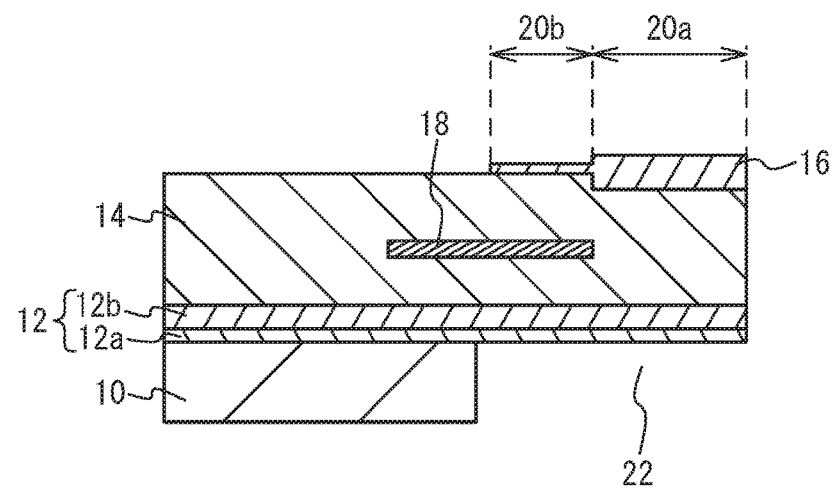
FIG. 11A and FIG. 11B are cross-sectional views of piezoelectric thin film resonators used for the simulation.
Figure 11B:
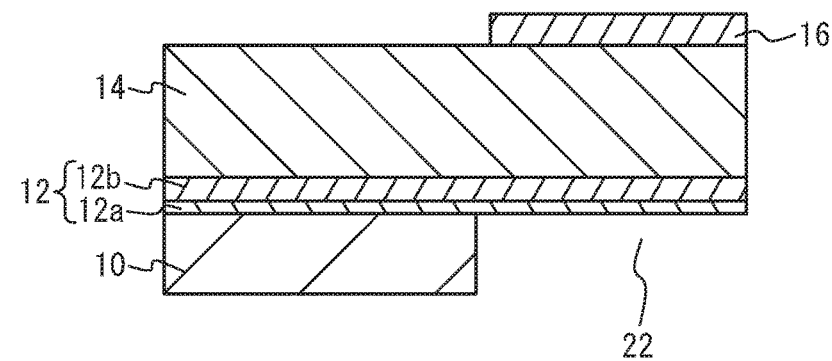

The inventors next investigated the reflection characteristic (S11) around the resonant frequencies of the piezoelectric thin film resonators using different materials for the insertion film 18 by using the finite element method. For comparison, the reflection characteristic (S11) around the resonant frequency of the piezoelectric thin film resonator without the insertion film 18 was also investigated. FIG. 11A and FIG. 11B are cross-sectional views of the piezoelectric thin film resonators used for the simulation. As illustrated in FIG. 11A, the lower layer 12a of the lower electrode 12 on the substrate 10 made of Si was configured to be made of a Cr film with a thickness of 100 nm, and the upper layer 12b was configured to be made of a Ru film with a thickness of 200 nm. The piezoelectric film 14 was configured to be made of an AlN film with a thickness of 1260 nm. The upper electrode 16 was configured to be made of only a Ru film, to have a thickness of 230 nm in the center region 20a, and to have a thickness, in the outer peripheral region 20b, that allows the cutoff frequency in the outer peripheral region 20b to be equal to the cutoff frequency in the center region 20a. The insertion film 18 was configured to have a thickness of 125 nm and a length of 1.9 µm. As illustrated in FIG. 11B, in the piezoelectric thin film resonator without the insertion film 18, the upper electrode 16 was configured to be made of only a Ru film, and to have a uniform thickness of 230 nm. Other configurations are the same as those illustrated in FIG. 11A.

Figure 12A:
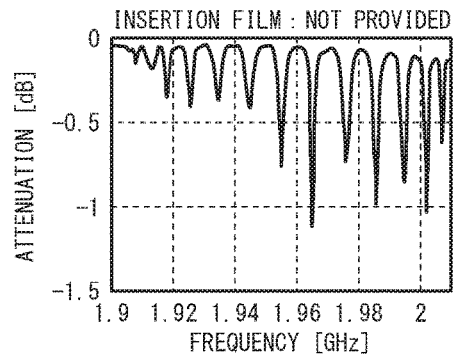
FIG. 12A illustrates the results of a simulation of a reflection characteristic around the resonant frequency of a piezoelectric thin film resonator without the insertion film.
Figure 12B:
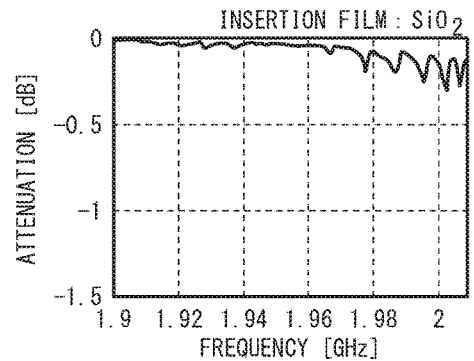
FIG. 12B through FIG. 12F are diagrams (No. 1) illustrating the simulation results of the reflection characteristics around the resonant frequency of the piezoelectric thin film resonators using different materials for the insertion film.
Figure 12C:
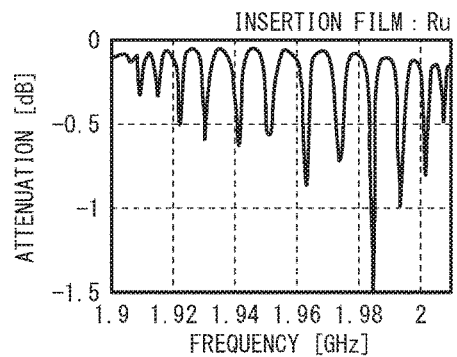
Figure 12D:
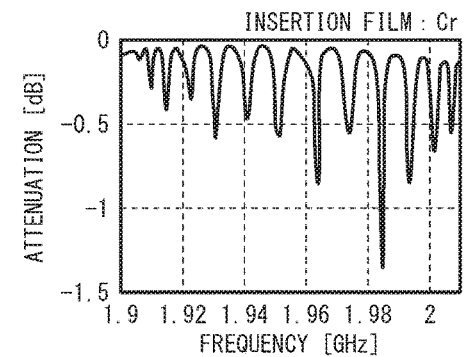
Figure 12E:
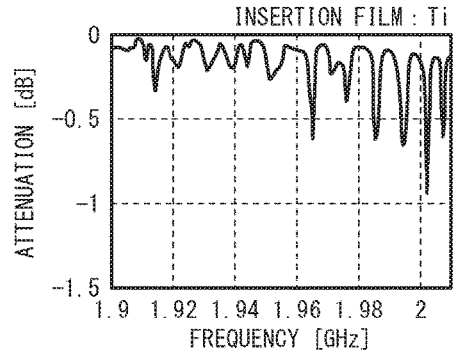
Figure 12F:
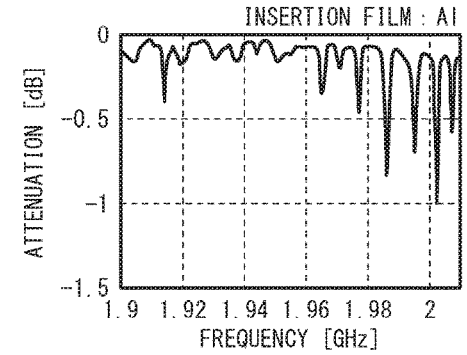
Figure 13A:
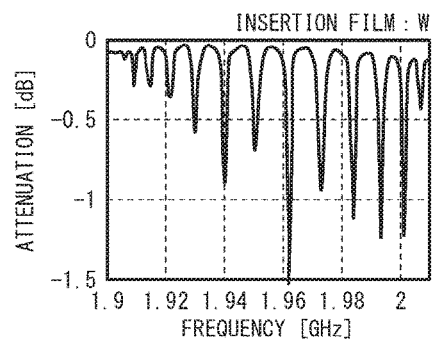
FIG. 13A through FIG. 13C are diagrams (No. 2) illustrating the simulation results of the reflection characteristics around the resonant frequency of the piezoelectric thin film resonators using different materials for the insertion film.
Figure 13B:
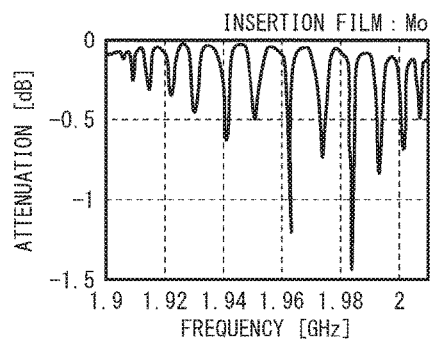
Figure 13C:
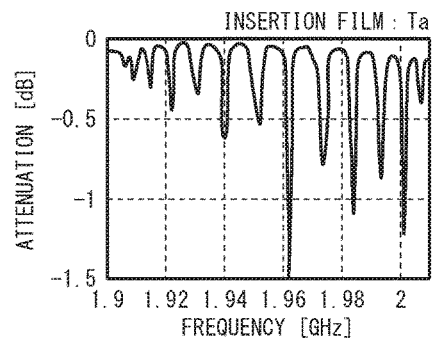

FIG. 12A illustrates the simulation result of the reflection characteristic (S11) around the resonant frequency of the piezoelectric thin film resonator without the insertion film 18. FIG. 12B through FIG. 13C illustrate the simulation results of the reflection characteristics (S11) around the resonant frequencies of the piezoelectric thin film resonators using different materials for the insertion film 18. FIG. 12A through FIG. 13C reveals that spurious at frequencies less than the resonant frequency is reduced when the insertion film 18 is made of a $SiO_2$ film, a Ti film, or an Al film. Especially when the insertion film 18 is made of a $SiO_2$ film, spurious at frequencies less than the resonant frequency is substantially reduced.

Therefore, to reduce spurious, the insertion film 18 is preferably a film, such as Ti or Al, with an acoustic impedance less than that of AlN, more preferably a film, such as $SiO_2$, with an acoustic impedance less than that of AlN and a Poisson's ratio less than that of AlN. The insertion film 18 may be a silicon oxide film containing another element. The examples of another element include, but not limited to, for example, fluorine and boron. The silicon oxide film containing such an element has an acoustic impedance less than that of AlN and a Poisson's ratio less than that of AlN.

In the second embodiment, as illustrated in FIG. 6A through FIG. 6C, the insertion film 18 is formed in the entire periphery of the outer peripheral region 20b, and the upper electrode 16 in the entire periphery of the outer peripheral region 20b is thinner than the upper electrode 16 in the center region 20a. This configuration effectively reduces spurious.

Figure 14A:
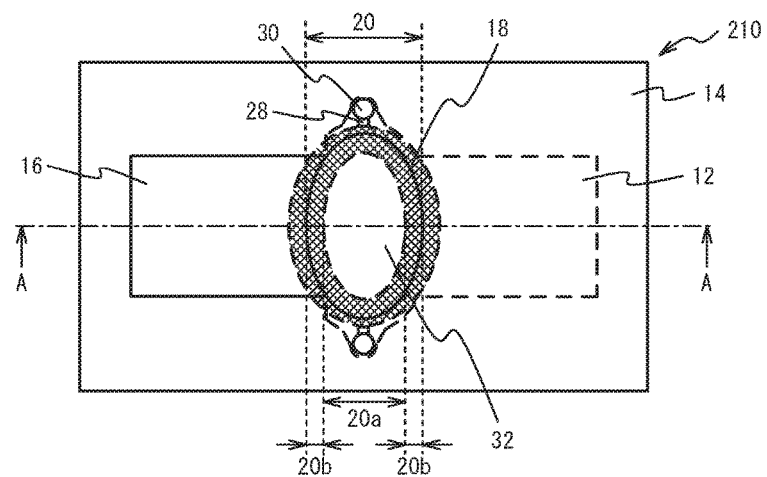
FIG. 14A is a top view of a piezoelectric thin film resonator in accordance with a first variation of the second embodiment.
Figure 14B:
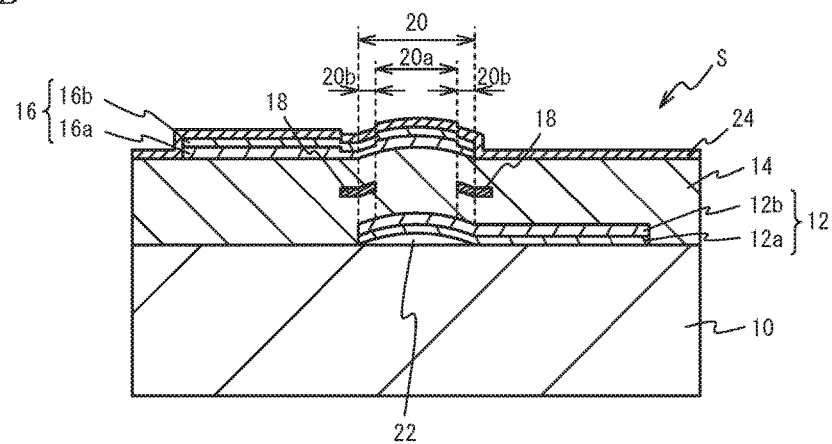
FIG. 14B is a cross-sectional view taken along line A-A of FIG. 14A.

FIG. 14A is a top view of a piezoelectric thin film resonator 210 of a first variation of the second embodiment, and FIG. 14B is a cross-sectional view taken along line A-A of FIG. 14A. FIG. 14B is a cross-sectional view of the series resonator S of the ladder-type filter. As in FIG. 6C, the parallel resonator P has a structure in which the mass load film 26 is located between the layers of the upper electrode 16 in FIG. 14A, and thus the description will be omitted (the same applies to a second variation of the second embodiment through a fifth embodiment).

As illustrated in FIG. 14A and FIG. 14B, in the piezoelectric thin film resonator 210 of the first variation of the second embodiment, the upper electrode 16 is thinner not only in the outer peripheral region 20b within the resonance region 20, but also from the outer peripheral region 20b to the outside of the resonance region 20. Other configurations are the same as those of the piezoelectric thin film resonator 200 of the second embodiment, and thus the description is omitted.

Figure 15A:
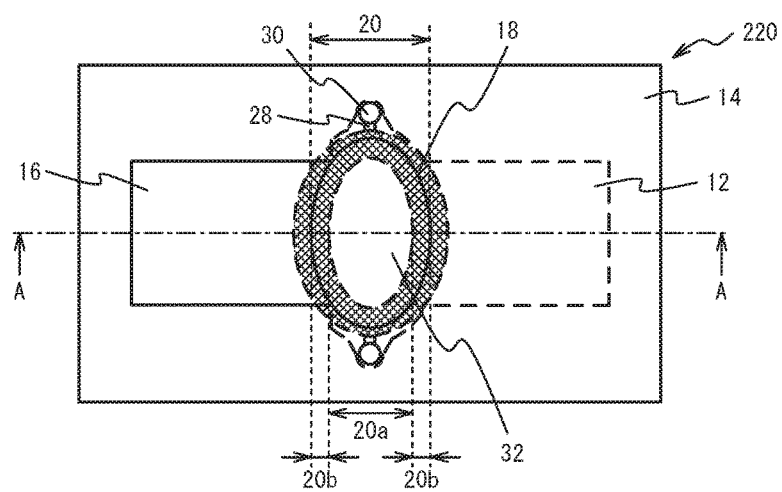
FIG. 15A is a top view of a piezoelectric thin film resonator in accordance with a second variation of the second embodiment.
Figure 15B:
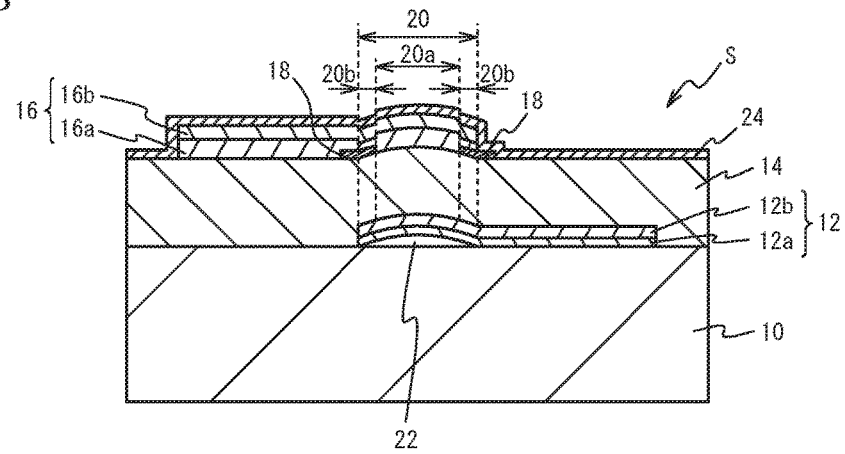
FIG. 15B is a cross-sectional view taken along line A-A of FIG. 15A.

FIG. 15A is a top view of a piezoelectric thin film resonator 220 in accordance with the second variation of the second embodiment, and FIG. 15B is a cross-sectional view taken along line A-A of FIG. 15A. As illustrated in FIG. 15A and FIG. 15B, in the piezoelectric thin film resonator 220 of the second variation of the second embodiment, the insertion film 18 is formed on the upper surface of the piezoelectric film 14. In other words, the insertion film 18 is formed between the piezoelectric film 14 and the upper electrode 16. Other configurations are the same as those of the piezoelectric thin film resonator 200 of the second embodiment, and thus the description is omitted.

Figure 16A:
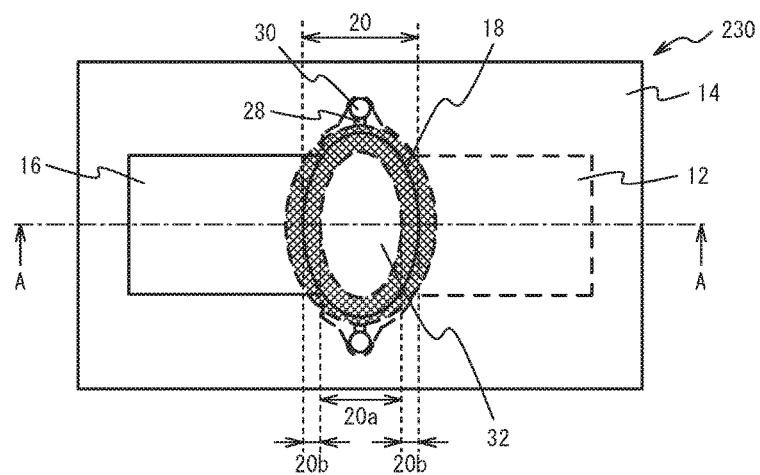
FIG. 16A is a top view of a piezoelectric thin film resonator in accordance with a third variation of the second embodiment.
Figure 16B:
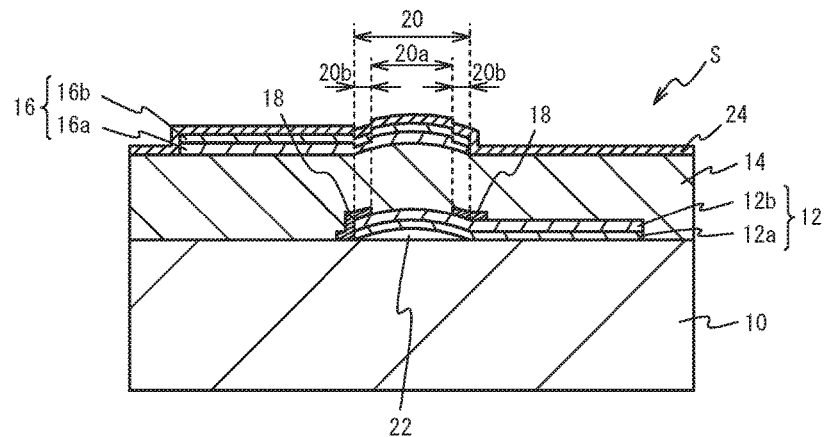
FIG. 16B is a cross-sectional view taken along line A-A of FIG. 16A.

FIG. 16A is a top view of a piezoelectric thin film resonator 230 in accordance with the third variation of the second embodiment, and FIG. 16B is a cross-sectional view taken along line A-A of FIG. 16A. As illustrated in FIG. 16A and FIG. 16B, in the piezoelectric thin film resonator 230 of the third variation of the second embodiment, the insertion film 18 is formed on the lower surface of the piezoelectric film 14. In other words, the insertion film 18 is formed between the piezoelectric film 14 and the lower electrode 12. Other configurations are the same as those of the piezoelectric thin film resonator 200 of the second embodiment, and thus the description is omitted.

As in the second embodiment and the second and third variations of the second embodiment, the insertion film 18 may be formed in the piezoelectric film 14, or may be formed on the upper surface or the lower surface of the piezoelectric film 14. Alternatively, the insertion film 18 may be formed in the piezoelectric film 14, on the upper surface of the piezoelectric film 14, and on the lower surface of the piezoelectric film 14.

Figure 17A:
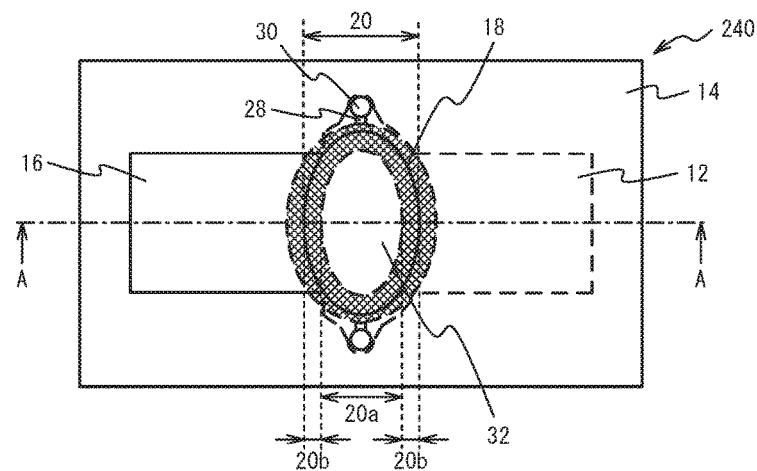
FIG. 17A is a top view of a piezoelectric thin film resonator in accordance with a fourth variation of the second embodiment.
Figure 17B:
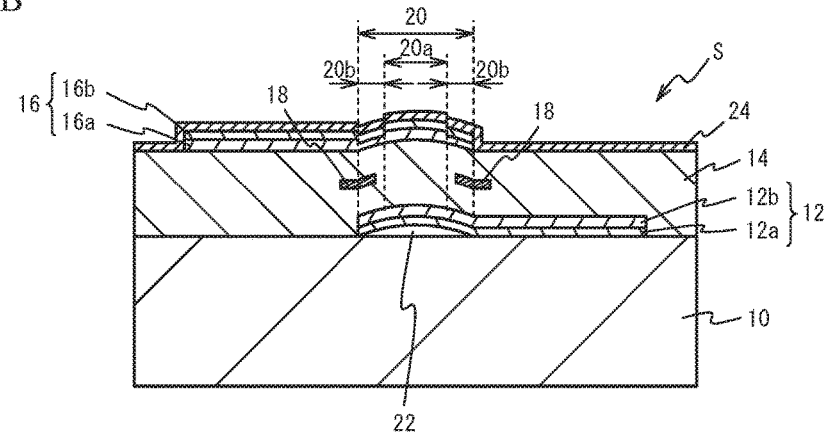
FIG. 17B is a cross-sectional view taken along line A-A of FIG. 17A.

FIG. 17A is a top view of a piezoelectric thin film resonator 240 in accordance with the fourth variation of the second embodiment, and FIG. 17B is a cross-sectional view taken along line A-A of FIG. 17A. As illustrated in FIG. 17A and FIG. 17B, in the piezoelectric thin film resonator 240 of the fourth variation of the second embodiment, the insertion film 18 is formed in only a part of the outer peripheral region 20b within the resonance region 20. Other configurations are the same as those of the piezoelectric thin film resonator 200 of the second embodiment, and thus the description is omitted.

Figure 18A:
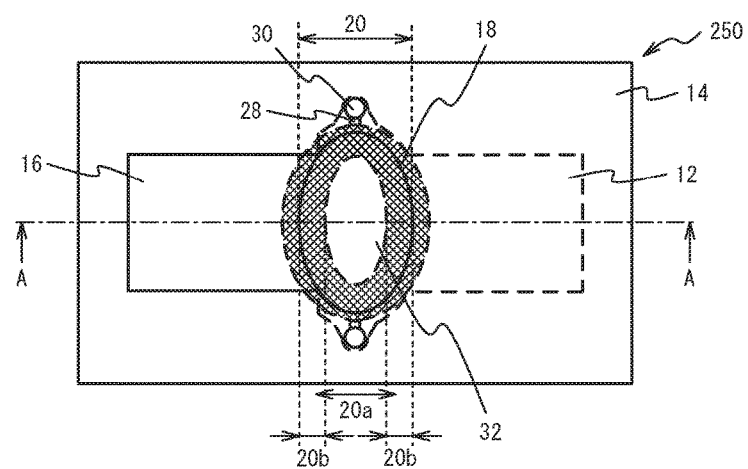
FIG. 18A is a top view of a piezoelectric thin film resonator in accordance with a fifth variation of the second embodiment.
Figure 18B:
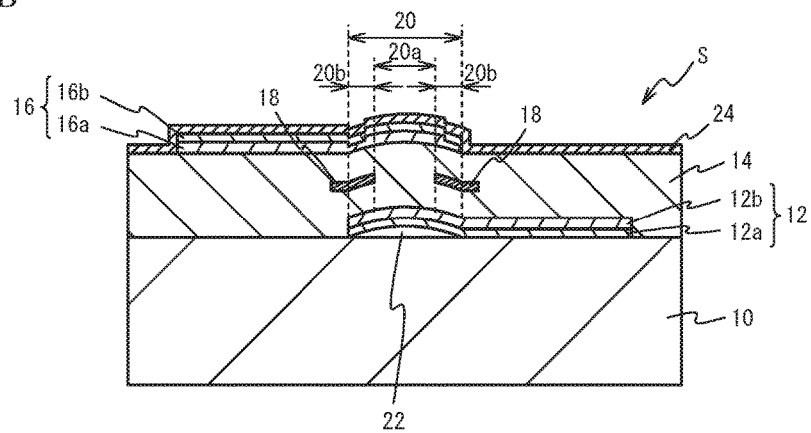
FIG. 18B is a cross-sectional view taken along line A-A of FIG. 18A.

FIG. 18A is a top view of a piezoelectric thin film resonator 250 in accordance with the fifth variation of the second embodiment, and FIG. 18B is a cross-sectional view taken along line A-A of FIG. 18A. As illustrated in FIG. 18A and FIG. 18B, in the piezoelectric thin film resonator 250 of the fifth variation of the second embodiment, the upper electrode 16 is made thinner in only a part of the outer peripheral region 20b within the resonance region 20. Other configurations are the same as those of the piezoelectric thin film resonator 200 of the second embodiment, and thus the description is omitted.

The second embodiment through the fifth variation of the second embodiment have described a case where the lower layer 16a of the upper electrode 16 is thinner in the outer peripheral region 20b than in the center region 20a as an example, but the upper layer 16b of the upper electrode 16 may be thinner in the outer peripheral region 20b, or both the lower and upper layers 16a and 16b may be thinner. The structure of the upper electrode 16 is not limited to the two-layer structure of the lower and upper layers 16a and 16b, and may be a single-layer structure or a layer structure including three or more layers. The lower electrode 12 may also have a single-layer structure or a layer structure including three or more layers.

Third Embodiment

Figure 19A:
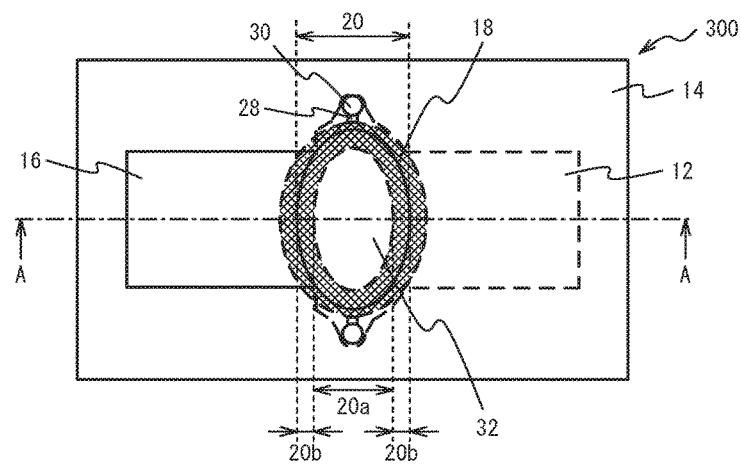
FIG. 19A is a top view of a piezoelectric thin film resonator in accordance with a third embodiment.
Figure 19B:
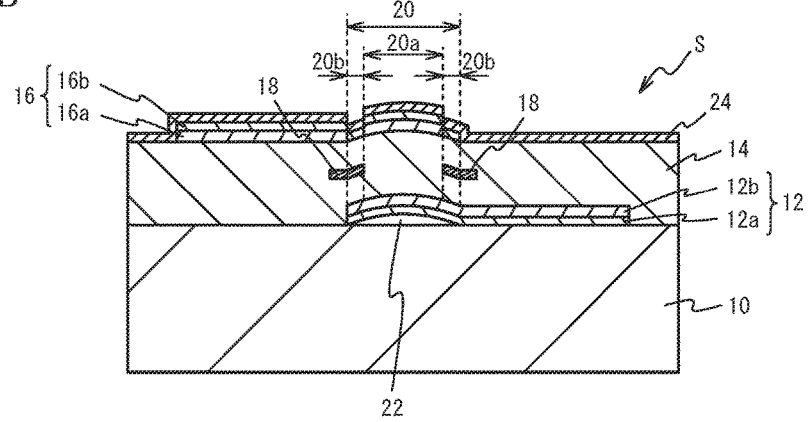
FIG. 19B is a cross-sectional view taken along line A-A of FIG. 19A.

FIG. 19A is a top view of a piezoelectric thin film resonator 300 in accordance with the third embodiment, and FIG. 19B is a cross-sectional view taken along line A-A of FIG. 19A. As illustrated in FIG. 19A and FIG. 19B, in the piezoelectric thin film resonator 300 of the third embodiment, the lower layer 16a of the upper electrode 16 is not formed and only the upper layer 16b is formed in the outer peripheral region 20b of the resonance region 20. Other configurations are the same as those of the piezoelectric thin film resonator 200 of the second embodiment, and thus the description is omitted.

As in the third embodiment, the number of metal layers of the upper electrode 16 in the outer peripheral region 20b within the resonance region 20 may be made less than the number of metal layers of the upper electrode 16 in the center region 20a to make the upper electrode 16 in the outer peripheral region 20b thinner than the upper electrode 16 in the center region 20a.

Fourth Embodiment

Figure 20A:
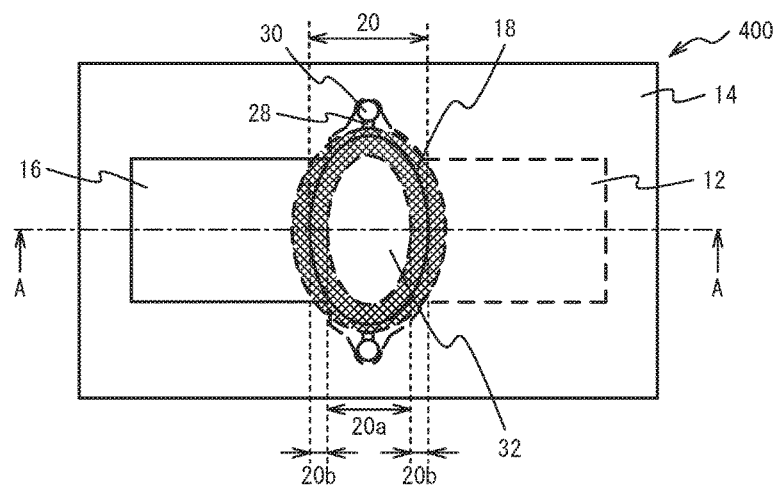
FIG. 20A is a top view of a piezoelectric thin film resonator in accordance with a fourth embodiment.
Figure 20B:
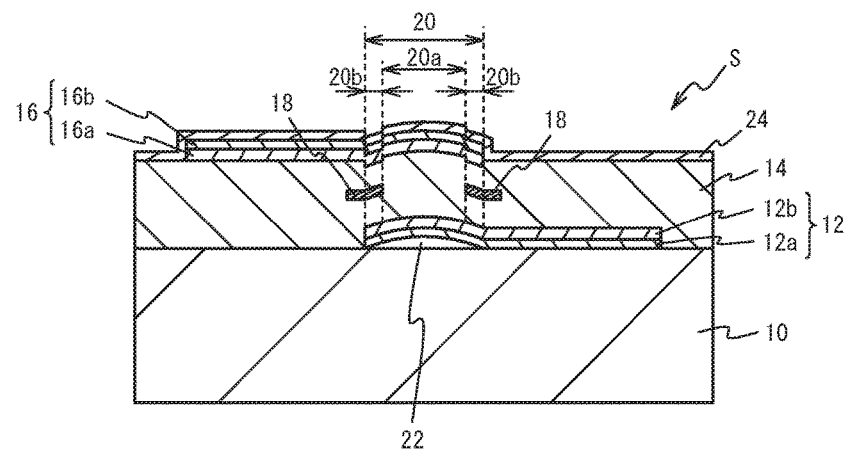
FIG. 20B is a cross-sectional view taken along line A-A of FIG. 20A.

FIG. 20A is a top view of a piezoelectric thin film resonator 400 in accordance with the fourth embodiment, and FIG. 20B is a cross-sectional view taken along line A-A of FIG. 20A. As illustrated in FIG. 20A and FIG. 20B, in the piezoelectric thin film resonator 400 of the fourth embodiment, the piezoelectric film 14 in the outer peripheral region 20b within the resonance region 20 is thinner than the piezoelectric film 14 in the center region 20a. The upper electrode 16 has an identical thickness in the center region 20a and the outer peripheral region 20b. Other configurations are the same as those of the piezoelectric thin film resonator 200 of the second embodiment, and thus the description is omitted.

Fifth Embodiment

Figure 21A:
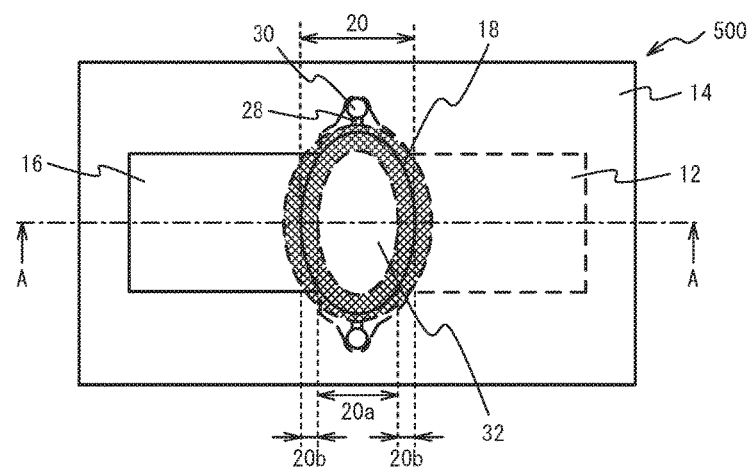
FIG. 21A is a top view of a piezoelectric thin film resonator in accordance with a fifth embodiment.
Figure 21B:
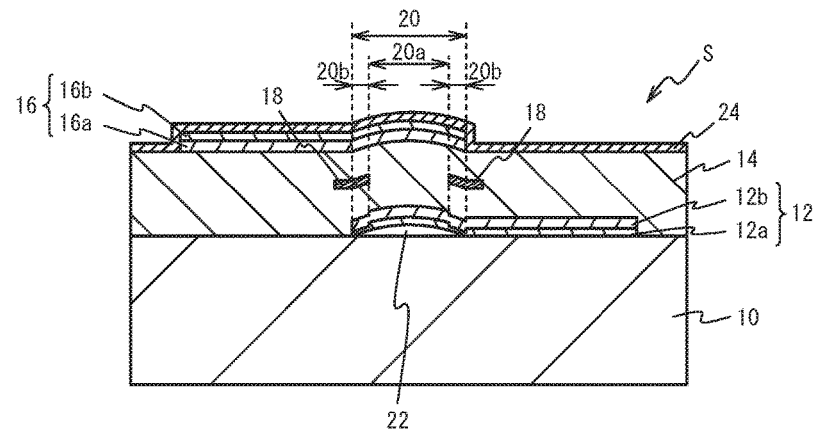
FIG. 21B is a cross-sectional view taken along line A-A of FIG. 21A.

FIG. 21A is a top view of a piezoelectric thin film resonator 500 in accordance with the fifth embodiment, and FIG. 21B is a cross-sectional view taken along line A-A of FIG. 21A. As illustrated in FIG. 21A and FIG. 21B, in the piezoelectric thin film resonator 500 of the fifth embodiment, the lower electrode 12 in the outer peripheral region 20b within the resonance region 20 is thinner than the lower electrode 12 in the center region 20a. The upper electrode 16 has an identical thickness in the center region 20a and the outer peripheral region 20b. Other configurations are the same as those of the piezoelectric thin film resonator 200 of the second embodiment, and thus the description is omitted.

As in the second through fifth embodiments, at least one of the lower electrode 12, the piezoelectric film 14, and the upper electrode 16 is only required to be thinner in the outer peripheral region 20b within the resonance region 20 than in the center region 20a. Two or more of the lower electrode 12, the piezoelectric film 14, and the upper electrode 16 may be thinner in the outer peripheral region 20b than in the center region 20a.

As in the first variation of the second embodiment, the lower electrode 12 may be thinner not only in the outer peripheral region 20b within the resonance region 20 but also from the outer peripheral region 20b to the outside of the resonance region 20 in the fifth embodiment. As in the fifth variation of the second embodiment, the lower electrode 12 may be thinner in only a part of the outer peripheral region 20b.

As in the third embodiment, the number of metal layers of the lower electrode 12 in the outer peripheral region 20b within the resonance region 20 may be made less than the number of metal layers of the lower electrode 12 in the center region 20a to make the lower electrode 12 in the outer peripheral region 20b thinner than the lower electrode 12 in the center region 20a in the fifth embodiment. That is, at least one of the upper and lower electrodes 16 and 12 in the outer peripheral region 20b may have the number of metal layers less than the number of metal layers of the at least one of the upper and lower electrodes 16 and 12 in the center region 20a.

The fifth embodiment has described a case where the lower layer 12a of the lower electrode 12 is thinner in the outer peripheral region 20b than in the center region 20a, but the upper layer 12b of the lower electrode 12 may be thinner in the outer peripheral region 20b, or both the lower and upper layers 12a and 12b may be thinner.

As in the second and third variations of the second embodiment, the insertion film 18 may be formed on the upper surface or the lower surface of the piezoelectric film 14 in the third through fifth embodiments.

Sixth Embodiment

Figure 22:
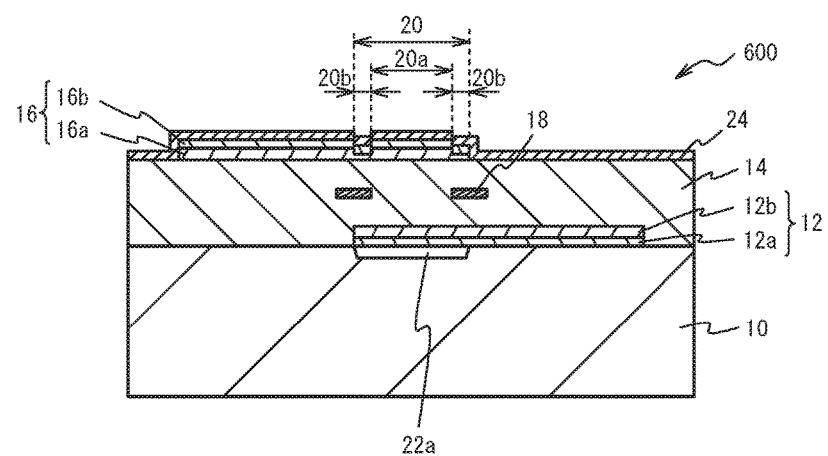
FIG. 22 is a cross-sectional view of a piezoelectric thin film resonator in accordance with a sixth embodiment.

FIG. 22 is a cross-sectional view of a piezoelectric thin film resonator 600 in accordance with a sixth embodiment. As illustrated in FIG. 22, the piezoelectric thin film resonator 600 of the sixth embodiment includes a recessed portion formed in the principal surface of the substrate 10. The lower electrode 12 is formed approximately flat on the principal surface of the substrate 10. This allows the recessed portion of the substrate 10 to function as an air gap 22a. The air gap 22a is formed so as to include the resonance region 20. Other configurations are the same as those of the piezoelectric thin film resonator 200 of the second embodiment, and thus the description is omitted. The air gap 22a may be formed so as to penetrate through the substrate 10.

The sixth embodiment has described a case where the air gap 22a is formed instead of the air gap 22 of the second embodiment, but the air gap 22a may be formed instead of the air gap 22 in the first variation of the second embodiment through the fifth embodiment.

Seventh Embodiment

Figure 23:
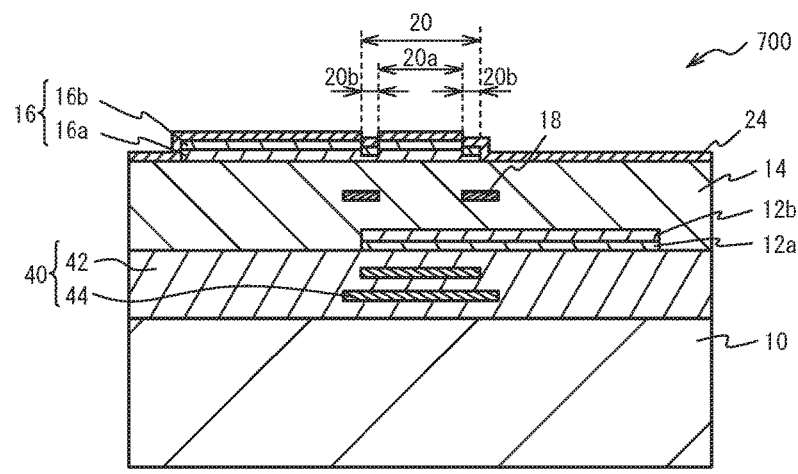
FIG. 23 is a cross-sectional view of a piezoelectric thin film resonator in accordance with a seventh embodiment.

FIG. 23 is a cross-sectional view of a piezoelectric thin film resonator 700 in accordance with a seventh embodiment. As illustrated in FIG. 23, the piezoelectric thin film resonator 700 of the seventh embodiment includes an acoustic mirror 40 formed below the lower electrode 12 of the resonance region 20. The acoustic mirror 40 is a film reflecting the acoustic wave propagating through the piezoelectric film 14, and includes a film 42 with a low acoustic impedance and a film 44 with a high acoustic impedance alternately formed. The film 42 with a low acoustic impedance and the film 44 with a high acoustic impedance basically have a film thickness of $\lambda/4$ ($\lambda$ is the wavelength of the acoustic wave), but the film thickness may be appropriately changed to obtain desired characteristics. In addition, the number of stacking layers of the film 42 with a low acoustic impedance and the film 44 with a high acoustic impedance is freely selected. Other configurations are the same as those of the piezoelectric thin film resonator 200 of the second embodiment, and thus the description is omitted.

The seventh embodiment has described a case where the acoustic mirror 40 is formed instead of the air gap 22 of the second embodiment, but the acoustic mirror 40 may be also formed instead of the air gap 22 in the first variation of the second embodiment through the fifth embodiment.

As described above, the piezoelectric thin film resonator may be a Film Bulk Acoustic Resonator (FBAR) in which the air gap 22 or 22a is formed between the lower electrode 12 and the substrate 10 in the resonance region 20 as in the first through sixth embodiments. As in the seventh embodiment, the piezoelectric thin film resonator may be a Solidly Mounted Resonator (SMR) in which the acoustic mirror 40 is formed below the lower electrode 12 in the resonance region 20.

The second through seventh embodiments have described a case where the resonance region 20 has an elliptical shape as an example, but the resonance region 20 may have another shape including a polygonal shape such as a quadrangle shape or a pentagonal shape.

Eighth Embodiment

Figure 24:
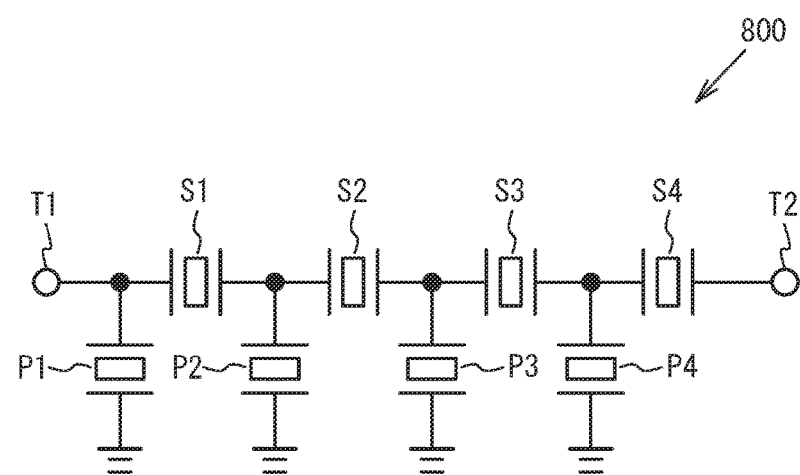
FIG. 24 illustrates a filter in accordance with an eighth embodiment.

FIG. 24 illustrates a filter 800 in accordance with an eighth embodiment. As illustrated in FIG. 24, the filter 800 of the eighth embodiment is a ladder-type filter that includes one or more series resonators S1 through S4 connected in series and one or more parallel resonators P1 through P4 connected in parallel between input and output terminals T1 and T2. At least one of the series resonators S1 through S4 and the parallel resonators P1 through P4 may be the piezoelectric thin film resonator according to any one of the first through seventh embodiments.

Ninth Embodiment

Figure 25:
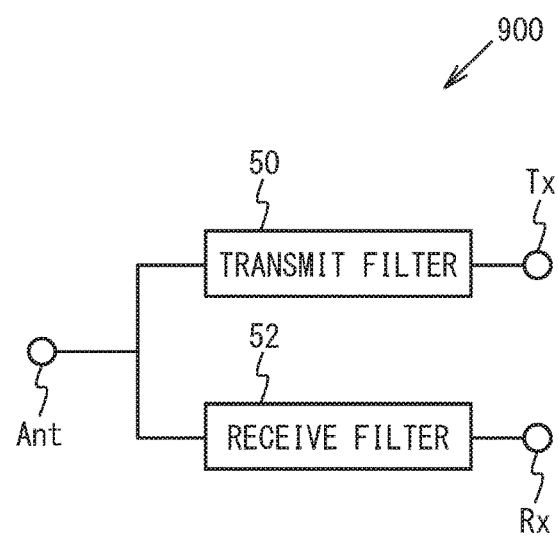
FIG. 25 illustrates a duplexer in accordance with a ninth embodiment.

FIG. 25 illustrates a duplexer 900 in accordance with a ninth embodiment. As illustrated in FIG. 25, the duplexer 900 of the ninth embodiment includes a transmit filter 50 connected between an antenna terminal Ant and a transmit terminal Tx and a receive filter 52 connected between the antenna terminal Ant and a receive terminal Rx. The transmit filter 50 and the receive filter 52 have different passbands. The transmit filter 50 passes signals within the transmit band, among signals input from the transmit terminal Tx, to the antenna terminal Ant as a transmission signal, and suppresses signals in other bands. The receive filter 52 passes signals within the receive band, among signals input from the antenna terminal Ant, to the receive terminal Rx as a reception signal, and suppresses other bands. At least one of the transmit filter 50 and the receive filter 52 may be the filter of the eighth embodiment.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:
   a substrate;
   a piezoelectric film that is located on the substrate and has a Poisson's ratio of 0.33 or less;
   a lower electrode and an upper electrode that face each other across the piezoelectric film; and
   an insertion film that is located in the piezoelectric film or on a lower surface or an upper surface of the piezoelectric film in an outer peripheral region within a resonance region, in which the lower electrode and the upper electrode face each other across the piezoelectric film, and is not located in a center region of the resonance region,
   wherein at least one of the lower electrode, the piezoelectric film, and the upper electrode in the outer peripheral region within the resonance region is thinner than the at least one of the lower electrode, the piezoelectric film, and the upper electrode in the center region of the resonance region, and wherein a cutoff frequency in the outer peripheral region within the resonance region is approximately equal to a cutoff frequency in the center region of the resonance region.

2. The piezoelectric thin film resonator according to claim 1, wherein an air gap is formed between the substrate and the lower electrode in the resonance region.

3. The piezoelectric thin film resonator according to claim 1, wherein a difference between a cutoff frequency and a minimum frequency of a dispersion curve of a thickness extension mode in the outer peripheral region within the resonance region is less than a difference between a cutoff frequency and a minimum frequency of a dispersion curve of a thickness extension mode in the center region of the resonance region.

4. The piezoelectric thin film resonator according to claim 1, wherein a multilayered film including the lower electrode, the piezoelectric film, and the upper electrode in the outer peripheral region within the resonance region is thinner than a multilayered film including the lower electrode, the piezoelectric film, and the upper electrode in the center region of the resonance region.

5. The piezoelectric thin film resonator according to claim 1, wherein the insertion film has an acoustic impedance less than an acoustic impedance of the piezoelectric film.

6. The piezoelectric thin film resonator according to claim 1, wherein the insertion film has a Poisson's ratio less than a Poisson's ratio of the piezoelectric film.

7. The piezoelectric thin film resonator according to claim 1, wherein the insertion film is a silicon oxide film or a silicon oxide film containing another element.

8. The piezoelectric thin film resonator according to claim 1, wherein the piezoelectric film is an aluminum nitride film or an aluminum nitride film containing another element.

9. A filter comprising the piezoelectric thin film resonator according to claim 1.

10. A piezoelectric thin film resonator comprising:
a substrate;
a piezoelectric film that is located on the substrate and has a Poisson's ratio of 0.33 or less;
a lower electrode and an upper electrode that face each other across the piezoelectric film; and
an insertion film that is located in the piezoelectric film or on a lower surface or an upper surface of the piezoelectric film in an outer peripheral region within a resonance region, in which the lower electrode and the upper electrode face each other across the piezoelectric film, and is not located in a center region of the resonance region, wherein a cutoff frequency in the outer peripheral region within the resonance region is approximately equal to a cutoff frequency in the center region of the resonance region, and a difference between the cutoff frequency and a minimum frequency of a dispersion curve of a thickness extension mode in the outer peripheral region within the resonance region is less than a difference between the cutoff frequency and a minimum frequency of a dispersion curve of a thickness extension mode in the center region of the resonance region.

11. The piezoelectric thin film resonator according to claim 10, wherein the insertion film has an acoustic impedance less than an acoustic impedance of the piezoelectric film.

12. The piezoelectric thin film resonator according to claim 10, wherein the insertion film is a silicon oxide film or a silicon oxide film containing another element.

13. The piezoelectric thin film resonator according to claim 10, wherein the insertion film has a Poisson's ratio less than a Poisson's ratio of the piezoelectric film.

14. The piezoelectric thin film resonator according to claim 10, wherein the piezoelectric film is an aluminum nitride film or an aluminum nitride film containing another element.

15. A filter comprising the piezoelectric thin film resonator according to claim 10.

16. The piezoelectric thin film resonator according to claim 10, wherein an air gap is formed between the substrate and the lower electrode in the resonance region.

17. A piezoelectric thin film resonator comprising:
a substrate;
a piezoelectric film that is located on the substrate and has a Poisson's ratio of 0.33 or less;
a lower electrode and an upper electrode that face each other across the piezoelectric film; and
an insertion film that is located in the piezoelectric film or on a lower surface or an upper surface of the piezoelectric film in an outer peripheral region within a resonance region, in which the lower electrode and the upper electrode face each other across the piezoelectric film, and is not located in a center region of the resonance region, wherein at least one of the lower electrode, the piezoelectric film, and the upper electrode in the outer peripheral region within the resonance region is thinner than the at least one of the lower electrode, the piezoelectric film, and the upper electrode in the center region of the resonance region, and wherein at least one of the lower electrode and the upper electrode in the outer peripheral region within the resonance region has a smaller number of metal layers than the at least one of the lower electrode and the upper electrode in the center region of the resonance region.

18. A piezoelectric thin film resonator comprising:
a substrate;
a piezoelectric film that is located on the substrate and is an aluminum nitride film or an aluminum nitride film containing another element;
a lower electrode and an upper electrode that face each other across the piezoelectric film; and
an insertion film that is located in the piezoelectric film or on a lower surface or an upper surface of the piezoelectric film in an outer peripheral region within a resonance region, in which the lower electrode and the upper electrode face each other across the piezoelectric film, and is not located in a center region of the resonance region, wherein at least one of the lower electrode, the piezoelectric film, and the upper electrode in the outer peripheral region within the resonance region is thinner than the at least one of the lower electrode, the piezoelectric film, and the upper electrode in the center region of the resonance region, and wherein a laminated film included the lower electrode, the piezoelectric film, the upper electrode, and the insertion film in the outer peripheral region within the resonance region is thinner than a laminated film included the lower electrode, the piezoelectric film, and the upper electrode in the center region of the resonance region.

19. The piezoelectric thin film resonator according to claim 18, wherein, at least one of the lower electrode, the piezoelectric film, and the upper electrode in a region where the insertion film is provided in the outer peripheral region within the resonance region is thinner than the at least one of the lower electrode, the piezoelectric film, and the upper electrode in the center region of the resonance region.

* * * * *